US008952728B2

(12) United States Patent
Takewaki et al.

(10) Patent No.: US 8,952,728 B2
(45) Date of Patent: Feb. 10, 2015

(54) SEMICONDUCTOR DEVICE AND METHOD OF DRIVING SEMICONDUCTOR DEVICE

(75) Inventors: Yoshiya Takewaki, Urasoe (JP); Yutaka Shionoiri, Kanagawa (JP); Koichiro Kamata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 150 days.

(21) Appl. No.: 13/217,578

(22) Filed: Aug. 25, 2011

(65) Prior Publication Data

US 2012/0049901 A1    Mar. 1, 2012

(30) Foreign Application Priority Data

Aug. 27, 2010    (JP) ................................. 2010-190591

(51) Int. Cl.
*H03K 5/153* (2006.01)
*H03K 19/00* (2006.01)

(52) U.S. Cl.
CPC ................. *H03K 19/0016* (2013.01)
USPC .................................. 327/59; 327/53; 327/54

(58) Field of Classification Search
USPC ............................................... 327/53, 54, 59
See application file for complete search history.

(56) References Cited

U.S. PATENT DOCUMENTS

| 5,497,119 | A | * | 3/1996 | Tedrow et al. ................. 327/540 |
| 5,546,042 | A | * | 8/1996 | Tedrow et al. ................. 327/538 |
| 5,731,856 | A | | 3/1998 | Kim et al. |
| 5,744,864 | A | | 4/1998 | Cillessen et al. |
| 5,936,455 | A | * | 8/1999 | Kobayashi et al. ........... 327/437 |
| 5,966,086 | A | | 10/1999 | Kubo et al. |
| 6,294,274 | B1 | | 9/2001 | Kawazoe et al. |
| 6,549,196 | B1 | * | 4/2003 | Taguchi et al. ................ 345/210 |
| 6,559,628 | B2 | * | 5/2003 | Kim ............................... 323/312 |
| 6,563,174 | B2 | | 5/2003 | Kawasaki et al. |
| 6,696,869 | B1 | * | 2/2004 | Tan ................................ 327/108 |

(Continued)

FOREIGN PATENT DOCUMENTS

| EP | 1737044 | 12/2006 |
| EP | 2226847 | 9/2010 |

(Continued)

OTHER PUBLICATIONS

Fortunato et al., "Wide-Bandgap High-Mobility ZnO Thin-Film Transistors Produced At Room Temperature," *Applied Physics Letters*, Sep. 27, 2004, vol. 85, No. 13, pp. 2541-2543.

(Continued)

*Primary Examiner* — Ryan Jager
(74) *Attorney, Agent, or Firm* — Husch Blackwell LLP

(57) ABSTRACT

An object of the invention is to reduce the power consumption of a semiconductor device that requires a plurality of reference potentials and a method of driving the semiconductor device. Disclosed is a semiconductor device having a potential divider circuit in which a potential supplied to a power supply line is resistively divided by resistors connected in series to the power supply line so that a desired potential is output through a switch transistor electrically connected to the power supply line. A drain terminal of the switch transistor is electrically connected to a gate terminal of a transistor provided in a circuit on the output side (or to one terminal of a capacitor) to form a node. The switch transistor has an off current low enough to hold the desired voltage in the node even when the potential is no more supplied to the power supply line.

17 Claims, 17 Drawing Sheets

(56) References Cited

U.S. PATENT DOCUMENTS

| | | | |
|---|---|---|---|
| 6,727,522 B1 | 4/2004 | Kawasaki et al. | |
| 6,794,916 B1* | 9/2004 | Varma | 327/218 |
| 6,888,526 B2* | 5/2005 | Morita | 345/95 |
| 7,005,838 B2 | 2/2006 | Tobita | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,071,669 B2 | 7/2006 | Morita | |
| 7,079,127 B2 | 7/2006 | Morita | |
| 7,105,868 B2 | 9/2006 | Nause et al. | |
| 7,106,321 B2 | 9/2006 | Morita | |
| 7,211,825 B2 | 5/2007 | Shih et al | |
| 7,277,038 B2* | 10/2007 | Yada et al. | 341/154 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,538,673 B2* | 5/2009 | Balachandran et al. | 340/572.1 |
| 7,674,650 B2 | 3/2010 | Akimoto et al. | |
| 7,732,819 B2 | 6/2010 | Akimoto et al. | |
| 7,944,282 B2 | 5/2011 | Maejima | |
| 8,294,380 B2* | 10/2012 | Bairanzade | 315/241 P |
| 8,878,172 B2 | 11/2014 | Ito et al. | |
| 2001/0046027 A1 | 11/2001 | Tai et al. | |
| 2002/0000985 A1* | 1/2002 | Hashimoto | 345/212 |
| 2002/0056838 A1 | 5/2002 | Ogawa | |
| 2002/0084775 A1* | 7/2002 | Kim | 323/315 |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0150653 A1* | 8/2004 | Sakamaki et al. | 345/592 |
| 2005/0017302 A1 | 1/2005 | Hoffman | |
| 2005/0017992 A1 | 1/2005 | Kudo et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0152400 A1* | 7/2006 | Yada et al. | 341/155 |
| 2006/0169973 A1 | 8/2006 | Isa et al. | |
| 2006/0170111 A1 | 8/2006 | Isa et al. | |
| 2006/0181494 A1 | 8/2006 | Morita | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0255874 A1* | 11/2006 | Okazaki et al. | 332/103 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0046474 A1* | 3/2007 | Balachandran et al. | 340/572.7 |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0122820 A1 | 5/2008 | Umeda et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1* | 10/2008 | Hoffman et al. | 438/104 |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0096819 A1 | 4/2009 | Kinoshita | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1* | 11/2009 | Hosono et al. | 257/43 |
| 2009/0280600 A1* | 11/2009 | Hosono et al. | 438/104 |
| 2010/0065844 A1* | 3/2010 | Tokunaga | 257/43 |
| 2010/0092800 A1 | 4/2010 | Itagaki et al. | |
| 2010/0109002 A1* | 5/2010 | Itagaki et al. | 257/43 |
| 2010/0320925 A1* | 12/2010 | Bairanzade | 315/241 P |
| 2011/0012822 A1* | 1/2011 | Park et al. | 345/99 |
| 2011/0101351 A1 | 5/2011 | Yamazaki | |
| 2012/0176392 A1* | 7/2012 | Uchida et al. | 345/555 |
| 2013/0162227 A1* | 6/2013 | Kodama et al. | 323/234 |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 01-088532 U | 6/1989 |
| JP | 05-145421 A | 6/1993 |
| JP | 5-251705 | 9/1993 |
| JP | 06-152418 A | 5/1994 |
| JP | 8-264794 | 10/1996 |
| JP | 09-135170 A | 5/1997 |
| JP | 11-505377 | 5/1999 |
| JP | 2000-044236 | 2/2000 |
| JP | 2000-150900 | 5/2000 |
| JP | 2000-165243 A | 6/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 2003-233354 | 8/2003 |
| JP | 2003-233355 | 8/2003 |
| JP | 2004-103957 | 4/2004 |
| JP | 2004-273614 | 9/2004 |
| JP | 2004-273732 | 9/2004 |
| JP | 2005-184455 A | 7/2005 |
| JP | 2006-163507 | 6/2006 |
| JP | 2006-227272 | 8/2006 |

(56) References Cited

FOREIGN PATENT DOCUMENTS

| | | |
|---|---|---|
| JP | 2008-270871 A | 11/2008 |
| JP | 2010-103360 A | 5/2010 |
| WO | WO 2004/114391 | 12/2004 |

OTHER PUBLICATIONS

Dembo et al., "RFCPUS on Glass and Plastic Substrates Fabricated by TFT Transfer Technology," *IEDM 05: Technical Digest of International Electron Devices Meeting*, Dec. 5, 2005, pp. 1067-1069.

Ikeda et al., "21.2: Full-Functional System Liquid Crystal Display Using CG-Silicon Technology," *SID 2004 Digest, SID International Symposium Digest of Technical Papers*, 2004, vol. 35, pp. 860-863.

Nomura et al., "Room-Temperature Fabrication of Transparent Flexible Thin-Film Transistors Using Amorphous Oxide Semiconductors," *Nature*, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," *Applied Physics Letters*, Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In—Ga—Zn—O TFTS," *SID 2008 Digest, SID International Symposium Digest of Technical Papers*, May 20, 2008, vol. 39, pp. 621-624.

Prins et al., "A Ferroelectric Transparent Thin-Film Transistor," *Applied Physics Letters*, Jun. 17, 1996, vol. 68, No. 25, pp. 3650-3652.

Nakamura et al., "The phase relations in the In2O3—Ga2ZnO4—ZnO system at 1350° C," *Journal of Solid State Chemistry*, Aug. 1, 1991, vol. 93, No. 2, pp. 298-315.

Kimizuka et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4—ZnO System," *Journal of Solid State Chemistry*, Apr. 1, 1995, vol. 116, No. 1, pp. 170-178.

Nomura et al., "Thin-Film Transistor Fabricated in Single-Crystalline Transparent Oxide Semiconductor," *Science*, May 23, 2003, vol. 300, No. 5623, pp. 1269-1272.

Masuda et al., "Transparent thin film transistors using ZnO as an active channel layer and their electrical properties," *Journal of Applied Physics*, Feb. 1, 2003, vol. 93, No. 3, pp. 1624-1630.

Asakuma et al., "Crystallization and Reduction of Sol-Gel-Derived Zinc Oxide Films by Irradiation With Ultraviolet Lamp," *Journal of Sol-Gel Science and Technology*, 2003, vol. 26, pp. 181-184.

Osada et al., "15.2: Development of Driver-Integrated Panel using Amorphous In—Ga—Zn—Oxide TFT," *SID 2009 Digest, SID International Symposium Digest of Technical Papers*, May 31, 2009, pp. 184-187.

Nomura et al., "Carrier transport in transparent oxide semiconductor with intrinsic structural randomness probed using single-crystalline InGaO3(ZnO)5 films," *Applied Physics Letters*, Sep. 13, 2004, vol. 85, No. 11, pp. 1993-1995.

Li et al., "Modulated Structures of Homologous Compounds InMO3(ZnO)m (M=In,Ga; m=Integer) Described by Four-Dimensional Superspace Group," *Journal of Solid State Chemistry*, 1998, vol. 139, pp. 347-355.

Son et al., "42.4L: Late-News Paper: 4 Inch QVGA AMOLED Driven by the Threshold Voltage Controlled Amorphous GIZO (Ga2O3—In2O3—ZnO) TFT," *SID 2008 Digest, SID International Symposium Digest of Technical Papers*, May 20, 2008, vol. 39, pp. 633-636.

Lee et al., "42.2: World'S Largest (15-Inch) XGA AMLCD Panel Using IGZO Oxide TFT," *SID 2008 Digest, SID International Symposium Digest of Technical Papers*, May 20, 2008, vol. 39, pp. 625-628.

Nowatari et al., "60.2: Intermediate Connector With Suppressed Voltage Loss for White Tandem OLEDS," *SID 2009 Digest, SID International Symposium Digest of Technical Papers*, May 31, 2009, vol. 40, pp. 899-902.

Kanno et al., "White Stacked Electrophosphorecent Organic Light-Emitting Devices Employing MOO3 as a Charge-Generation Layer," *Advanced Materials*, 2006, vol. 18, No. 3, pp. 339-342.

Tsuda et al., "Ultra Low Power Consumption Technologies for Mobile TFT-LCDs," *Proceedings of the 9th International Display Workshops*, Dec. 4, 2002, pp. 295-298.

Van De Walle, "Hydrogen as a Cause of Doping In Zinc Oxide," *Physical Review Letters*, Jul. 31, 2000, vol. 85, No. 5, pp. 1012-1015.

Fung et al., "2-D Numerical Simulation of High Performance Amorphous In—Ga—Zn—O TFTs for Flat Panel Displays," *The Japan Society of Applied Physics Digest of Technical Papers*, Jul. 2, 2008, pp. 251-252.

Jeong et al., "3.1: Distinguished Paper: 12.1-Inch WXGA AMOLED Display Driven by Indium—Gallium—Zinc Oxide TFTs Array," *SID 2008 Digest, SID International Symposium Digest of Technical Papers*, May 20, 2008, vol. 39, No. 1, pp. 1-4.

Park et al., "High performance amorphous oxide thin film transistors with self-aligned top-gate structure," *Technical Digest of International Electron Devices Meeting*, Dec. 7, 2009, pp. 191-194.

Kurokawa et al., "UHF RFCPUS on Flexible and Glass Substrates for Secure RFID Systems," *Journal of Solid-State Circuits*, 2008, vol. 43, No. 1, pp. 292-299.

Ohara et al., "Amorphous In—Ga—Zn—Oxide TFTs with Suppressed Variation for 4.0 inch QVGA AMOLED Display," *The Japan Society of Applied Physics Digest of Technical Papers*, Jul. 1, 2009, pp. 227-230.

Coates et al., "Optical Studies of the Amorphous Liquid-Cholesteric Liquid Crystal Transition: The Blue Phase," *Physics Letters*, Sep. 10, 1973, vol. 45A, No. 2, pp. 115-116.

Cho et al., "21.2:Al and Sn-Doped Zinc Indium Oxide Thin Film Transistors for AMOLED Back-Plane," *SID 2009 Digest, SID International Symposium Digest of Technical Papers*, May 31, 2009, pp. 280-283.

Lee et al., "15.4: Excellent Performance of Indium—Oxide-Based Thin-Film Transistors by DC Sputtering," *SID 2009 Digest, SID International Symposium Digest of Technical Papers*, May 31, 2009, pp. 191-193.

Jin et al., "65.2:Distinguished Paper:World-Largest (6.5") Flexible Full Color Top Emission AMOLED Display on Plastic Film and Its Bending Properties," *SID 2009 Digest, SID International Symposium Digest of Technical Papers*, May 31, 2009, pp. 983-985.

Sakata et al., "Development of 4.0-In. AMOLED Display With Driver Circuit Using Amorphous In—Ga—Zn—Oxide TFTS," *Proceedings of the 16th International Display Workshops*, 2009, pp. 689-692.

Park et al., "Amorphous Indium—Gallium—Zinc Oxide TFTS and Their Application for Large Size AMOLED," *AM-FPD Digest of Technical Papers*, Jul. 2, 2008, pp. 275-278.

Park et al., "Challenge to Future Displays: Transparent AM-OLED Driven by Peald Grown ZnO TFT," *IMID Digest*, 2007, pp. 1249-1252.

Godo at al., "Temperature Dependence of Characteristics and Electronic Structure for Amorphous In—Ga—Zn—Oxide TFT," *AM-FPD Digest of Technical Papers*, Jul. 1, 2009, pp. 41-44.

Osada et al., "Development of Driver-Integrated Panel Using Amorphous In—Ga—Zn—Oxide TFT," *AM-FPD Digest of Technical Papers*, Jul. 1, 2009, pp. 33-36.

Hirao et al., "Novel Top-Gate Zinc Oxide Thin-Film Transistors (ZnO TFTS) for AMLCDS," *Journal of the SID*, 2007, vol. 15, No. 1, pp. 17-22.

Hosono, "68.3:Invited Paper:Transparent Amorphous Oxide Semiconductors for High Performance TFT," *SID 2007 Digest, SID International Symposium Digest of Technical Papers*, 2007, vol. 38, pp. 1830-1833.

Godo et al., "P-9:Numerical Analysis on Temperature Dependence of Characteristics of Amorphous In—Ga—Zn—Oxide TFT," *SID 2009 Digest, SID International Symposium Digest of Technical Papers*, May 31, 2009, pp. 1110-1112.

Ohara et al., "21.3:4.0 In. QVGA AMOLED Display Using In—Ga—Zn—Oxide TFTS With a Novel Passivation Layer," *SID 2009 Digest, SID International Symposium Digest of Technical Papers*, May 31, 2009, pp. 284-287.

(56) References Cited

OTHER PUBLICATIONS

Miyasaka, "58.2: Invited Paper: Suftla Flexible Microelectronics on Their Way to Business," *SID 2007 Digest, SID International Symposium Digest of Technical Papers*, 2007, vol. 38, pp. 1673-1676.

Chern et al., "An Analytical Model for the Above-Threshold Characteristics of Polysilicon Thin-Film Transistors," *IEEE Transactions on Electron Devices*, Jul. 1, 1995, vol. 42, No. 7, pp. 1240-1246.

Kikuchi et al., "39.1:Invited Paper:Optically Isotropic Nano-Structured Liquid Crystal Composites for Display Applications," *SID 2009 Digest, SID International Symposium Digest of Technical Papers*, May 31, 2009, pp. 578-581.

Asaoka et al., "29.1:Polarizer-Free Reflective LCD Combined With Ultra Low-Power Driving Technology," *SID 2009 Digest, SID International Symposium Digest of Technical Papers*, May 31, 2009, pp. 395-398.

Lee et al., "Current Status of, Challenges to, and Perspective View of AM-OLED", *Proceedings of the 13th International Display Workshops*, Dec. 7, 2006, pp. 663-666.

Kikuchi et al., "62.2:Invited Paper:Fast Electro-Optical Switching in Polymer-Stabilized Liquid Crystalline Blue Phases for Display Application," *SID 2007 Digest, SID International Symposium Digest of Technical Papers*, 2007, vol. 38, pp. 1737-1740.

Nakamura "Synthesis of Homologous Compound with New Long-Period Structure," *NIRIM Newsletter*, Mar. 1, 1995, vol. 150, pp. 1-4.

Kikuchi et al., "Polymer-Stabilized Liquid Crystal Blue Phases," *Nature Materials*, Sep. 2, 2002, vol. 1, pp. 64-68.

Kimizuka et al., "Spinel, YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C," *Journal of Solid State Chemistry*, 1985, vol. 60, pp. 382-384.

Kitzerow et al., "Observation of Blue Phases in Chiral Networks," *Liquid Crystals*, 1993, vol. 14, No. 3, pp. 911-916.

Costello et al., "Electron Microscopy of a Cholesteric Liquid Crystal and Its Blue Phase," *Physical Review B.* , May 1, 1984, vol. 29, No. 5, pp. 2957-2959.

Meiboom et al., "Theory of the Blue Phase of Cholesteric Liquid Crystals," *Physical Review Letters*, May 4, 1981, vol. 46, No. 18, pp. 1216-1219.

Park et al., "42.3: Transparent ZnO Thin Film Transistor for the Application of High Aperture Ratio Bottom Emission AM-OLED Display," *SID 2008 Digest, SID International Symposium Digest of Technical Papers*, May 20, 2008, vol. 39, pp. 629-632.

Orita et al., "Mechanism of Electrical Conductivity of Transparent InGaZnO4," *Physical Review B*, Jan. 15, 2000, vol. 61, No. 3, pp. 1811-1816.

Nomura et al., "Amorphous Oxide Semiconductors for High-Performance Flexible Thin-Film Transistors," *Japanese Journal of Applied Physics*, 2006, vol. 45, No. 5B, pp. 4303-4308.

Janotti et al., "Native Point Defects in ZnO," *Physical Review B*, Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," *Applied Physics Letters*, 2008, vol. 92, pp. 072104-1-072104-3.

Hsieh et al., "P-29:Modeling of Amorphous Oxide Semiconductor Thin Film Transistors and Subgap Density of States," *SID 2008 Digest, SID International Symposium Digest of Technical Papers*, 2008, vol. 39, pp. 1277-1280.

Janotti et al., "Oxygen Vacancies in ZnO," *Applied Physics Letters*, 2005, vol. 87, pp. 122102-1-122102-3.

Oba et al., "Defect energetics in ZnO: A hybrid Hartree-Fock density functional study," *Physical Review B*, 2008, vol. 77, pp. 245202-1-245202-6.

Orita et al., "Amorphous transparent conductive oxide InGaO3(ZnO)m (m<4):a Zn4s conductor," *Philosophical Magazine*, 2001, vol. 81, No. 5, pp. 501-515.

Hosono et al., "Working hypothesis to explore novel wide band gap electrically conducting amorphous oxides and examples," *Journal of Non-Crystalline Solids*, 1996, vol. 198-200, pp. 165-169.

Mo et al., "Amorphous Oxide TFT Backplanes for Large Size AMOLED Displays," *Proceedings of the 6th International Display Workshops*, Dec. 3, 2008, pp. 581-584.

Kim et al., "High-Performance oxide thin film transistors passivated by various gas plasmas", *214th ECS Meeting*, 2008, No. 2317.

Clark et al., "First Principles Methods Using Castep," *Zeitschrift fur Kristallographie*, 2005, vol. 220, pp. 567-570.

Lany et al., "Dopability, Intrinsic Conductivity, and Nonstoichiometry of Transparent Conducting Oxides," *Physical Review Letters*, Jan. 26, 2007, vol. 98, pp. 045501-1-045501-4.

Park.J et al., "Dry etching of ZnO films and plasma-induced damage to optical properties," *Journal of Vacuum Science & Technology B*, Mar. 1, 2003, vol. 21, No. 2, pp. 800-803.

Oh et al., "Improving the Gate Stability of ZnO Thin-Film Transistors With Aluminum Oxide Dielectric Layers," *Journal of the Electrochemical Society*, 2008, vol. 155, No. 12, pp. H1009-H1014.

Ueno et al., "Field-Effect Transistor on SrTiO3 With Sputtered Al2O3 Gate Insulator," *Applied Physics Letters*, Sep. 1, 2003, vol. 83, No. 9, pp. 1755-1757.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Lee.H et al., "Current Status of, Challenges to, and Perspective View of AM-OLED ,", IDW '06 : Proceedings of the 13th International Display Workshops, Dec. 7, 2006, pp. 663-666.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

\* cited by examiner 130   450a   159

450b

453

SEMICONDUCTOR DEVICE AND METHOD OF DRIVING SEMICONDUCTOR DEVICE

BACKGROUND OF THE INVENTION

1. Field of the Invention

The present invention relates to a semiconductor device and a method of driving the semiconductor device.

Note that in this specification, the term semiconductor device refers to all devices that can function by utilizing semiconductor characteristics, and electrooptic devices, semiconductor circuits, and electronic devices are all semiconductor devices.

2. Description of the Related Art

Some of a variety of semiconductor devices require a plurality of reference potentials for driving. One means for supplying such reference potentials is a method in which a high potential is divided into the desired potentials by a plurality of resistors connected in series.

Requirements for reference potentials that should be supplied and a circuit that supplies the reference potentials depend on uses of the semiconductor device, and circuits for generation of reference potentials which meet the requirements have been developed (e.g., see Patent Document 1). Patent Document 1 reports a circuit for generation of reference potentials which can suppress an increase in its size and can adjust the reference potentials while ensuring sufficient accuracy.

REFERENCE

Patent Document 1: Japanese Published Patent Application No. 2006-163507

SUMMARY OF THE INVENTION

An object is to reduce the power consumption of such a semiconductor device that requires a plurality of reference potentials and a method of driving the semiconductor device.

A semiconductor device disclosed in this specification has a potential divider circuit in which a potential supplied to a power supply line is resistively divided by a plurality of resistors connected in series to the power supply line, so that a desired potential is output through a switch transistor electrically connected to the power supply line. A drain terminal of the switch transistor and a gate terminal of a transistor provided in an operational amplifier circuit on the output side are electrically connected to form a node.

First, the switch transistor is turned on, and the desired potential into which a potential is divided by the plurality of resistors is supplied to (stored in) the node from the power supply line. After the supply of the desired potential, the switch transistor is turned off, and the potential is held in the node. By being held in the node, the desired potential can be output even when potential supply from the power supply line is interrupted.

As the switch transistor with which the node is formed and a potential is held, a transistor having a material that enables a sufficient reduction in off-state current, e.g., a wide-gap semiconductor material (more specifically, a semiconductor material whose energy gap Eg exceeds 3 eV, for example) as a semiconductor layer is used. By use of a semiconductor material that enables a sufficient reduction in the off-state current of a transistor, a potential can be held for a long period. One of such wide-gap semiconductor material is an oxide semiconductor material. In the semiconductor device disclosed in this specification, a transistor including an oxide semiconductor layer using the oxide semiconductor material can be suitably used.

Thus, continuous potential supply to the power supply line is not necessarily performed, and a period for interruption of the potential supply to the power supply line can be provided; consequently, the power consumption can be reduced. Selection of whether a potential is supplied to the power supply line or not can be realized with a transistor that controls a potential supplied to a resistor and that is connected to the power supply line.

Instead of the switch transistor, a transistor whose gate and source terminals are electrically connected may be used.

Further, the drain terminal of the switch transistor (or the transistor whose gate and source terminals are electrically connected) and one terminal of a capacitor provided in a circuit on the output side may be electrically connected to form a node.

One embodiment of a structure of the invention disclosed in this specification is a semiconductor device having a potential divider circuit which has a power supply line to which a first resistor and a second resistor are connected in series, a selection line, a switch transistor including an oxide semiconductor layer and a gate terminal that is electrically connected to the selection line, and an operational amplifier circuit including a transistor electrically connected to the power supply line through the switch transistor. The first resistor and the second resistor are electrically connected to a source terminal of the switch transistor. A drain terminal of the switch transistor is electrically connected to a gate terminal of the transistor included in the operational amplifier circuit.

Another embodiment of a structure of the invention disclosed in this specification is a semiconductor device having a potential divider circuit which has a power supply line to which a first resistor and a second resistor are connected in series, a selection line, a switch transistor including an oxide semiconductor layer and a gate terminal that is electrically connected to the selection line, and an operational amplifier circuit including a transistor electrically connected to the power supply line through the switch transistor. The operational amplifier circuit includes a differential input circuit having a first transistor and a second transistor, a current mirror circuit having a third transistor and a fourth transistor, and a constant current source. A first source terminal of the first transistor and a second source terminal of the second transistor are electrically connected to the constant current source. A third source terminal of the third transistor is electrically connected to a fourth source terminal of the fourth transistor. A first drain terminal of the first transistor and a third drain terminal of the third transistor are electrically connected to a third gate terminal of the third transistor and a fourth gate terminal of the fourth transistor. A second gate terminal of the second transistor and a second drain terminal of the second transistor are electrically connected to a fourth drain terminal of the fourth transistor. The first resistor and the second resistor are electrically connected to a source terminal of the switch transistor. A drain terminal of the switch transistor is electrically connected to a first gate terminal of the first transistor included in the operational amplifier circuit.

Another embodiment of a structure of the invention disclosed in this specification is a semiconductor device having a potential divider circuit which has a power supply line to which a first resistor and a second resistor are connected in series, a selection line, a switch transistor including an oxide semiconductor layer and a gate terminal that is electrically connected to the selection line, and a capacitor electrically connected to the power supply line through the switch transistor. The first resistor and the second resistor are electrically connected to a source terminal of the switch transistor. A drain terminal of the switch transistor is electrically connected to one terminal of the capacitor.

Another embodiment of a structure of the invention disclosed in this specification is a semiconductor device having a potential divider circuit which has a power supply line to which a first resistor and a second resistor are connected in series, the first resistor, the second resistor, a transistor including an oxide semiconductor layer and a gate terminal and a source terminal electrically connected, and a transistor electrically connected to the power supply line through the transistor including an oxide semiconductor layer. A drain terminal of the transistor including an oxide semiconductor layer is electrically connected to a gate terminal of the transistor.

In any of the above structures, the power supply line may have a transistor including an oxide semiconductor layer so that a potential supplied to the power supply line may be supplied to the first resistor and the second resistor through the transistor including an oxide semiconductor layer. In addition, a structure in which the gate terminal of the transistor including an oxide semiconductor layer which is connected to the power supply line is electrically connected to the gate terminal of the switch transistor may be formed.

Further, in any of the above structures, the semiconductor device can have a potential supply source supplying a potential to the potential divider circuit, and a load to which the potential is supplied from the potential divider circuit and the potential supply source.

Another embodiment of a structure of the invention disclosed in this specification is a method of driving a semiconductor device having a potential divider circuit which has a power supply line to which a first resistor and a second resistor are connected in series, a selection line, a switch transistor including an oxide semiconductor layer and a gate terminal that is electrically connected to the selection line, and an operational amplifier circuit including a transistor electrically connected to the power supply line through the switch transistor, in which the first resistor and the second resistor are electrically connected to a source terminal of the switch transistor, a drain terminal of the switch transistor and a gate terminal of the transistor included in the operational amplifier circuit are electrically connected to form a node, a potential supplied to the power supply line is divided by the first resistor and the second resistor, a potential into which the potential supplied to the power supply line is divided is supplied to the operational amplifier circuit through the switch transistor when the switch transistor is turned on, the potential into which the potential supplied to the power supply line is divided is held in the node when the switch transistor is turned off, and the potential into which the potential supplied to the power supply line is divided is output through the switch transistor and the operational amplifier circuit.

Another embodiment of a structure of the invention disclosed in this specification is a method of driving a semiconductor device having a potential divider circuit which has a power supply line to which a first resistor and a second resistor are connected in series, a selection line, a switch transistor including an oxide semiconductor layer and a gate terminal that is electrically connected to the selection line, and a capacitor electrically connected to the power supply line through the switch transistor, in which the first resistor and the second resistor are electrically connected to a source terminal of the switch transistor, a drain terminal of the switch transistor and one terminal of the capacitor are electrically connected to form a node, a potential supplied to the power supply line is divided by the first resistor and the second resistor, a potential into which the potential supplied to the power supply line is divided is supplied to the capacitor through the switch transistor when the switch transistor is turned on, the potential into which the potential supplied to the power supply line is divided is held in the node when the switch transistor is turned off, and the potential into which the potential supplied to the power supply line is divided is output through the switch transistor and the capacitor.

In any of the above structures, the power supply line can have a transistor including an oxide semiconductor layer. The potential supplied to the power supply line can be supplied to the first resistor and the second resistor through the transistor including an oxide semiconductor layer when the transistor including an oxide semiconductor layer is turned on. The transistor including an oxide semiconductor layer can be turned off when the switch transistor is turned off.

Note that in this specification and the like, the term "on" or "over" and the term "under" or "below" do not limit components to having the positional relationship in which one of the components is placed "directly on" and "directly under" the other. For example, the expression "a gate electrode over a gate insulating layer" does not exclude the case where there is an additional component between the gate insulating layer and the gate electrode. Moreover, the terms "on", "over" "under", and "below" are used simply for convenience of explanation.

In addition, in this specification and the like, the term "electrode" or "wiring" does not limit the function of a component. For example, an "electrode" is sometimes used as part of a "wiring", and vice versa. Further, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be interchanged in this specification.

Note that in this specification and the like, the expression "electrically connected" includes the case where components are connected through an "object having any electric function". There is no particular limitation on the "object having any electric function" as far as electric signals can be transmitted and received between components that are connected through the object. Examples of the "object having any electric function" are a switching element, such as a transistor, a resistor, an inductor, a capacitor, and elements with a variety of functions as well as an electrode and a wiring.

A semiconductor device has a potential divider circuit in which a potential supplied to the power supply line is resistively divided by a plurality of resistors connected in series to the power supply line, so that a desired potential is output through a switch transistor electrically connected to a power supply line. A drain terminal of the switch transistor and a gate terminal of a transistor provided in an operational amplifier circuit on the output side are electrically connected to form a node.

By being held in the node, the desired potential can be output even when potential supply from the power supply line is interrupted.

Thus, continuous potential supply to the power supply line is not necessarily performed, and a period for interruption of the potential supply to the power supply line can also be provided; consequently, it is possible to reduce the power consumption of the semiconductor device or in a method of driving the semiconductor device.

Since the off-state current of a transistor including an oxide semiconductor which is used for a switch transistor is extremely low, a potential can be held for an extremely long time. Consequently, a period for interruption of potential supply can be provided, and the power consumption can be significantly reduced as compared to the case where a potential is constantly supplied.

DETAILED DESCRIPTION OF THE INVENTION

Figure 1:
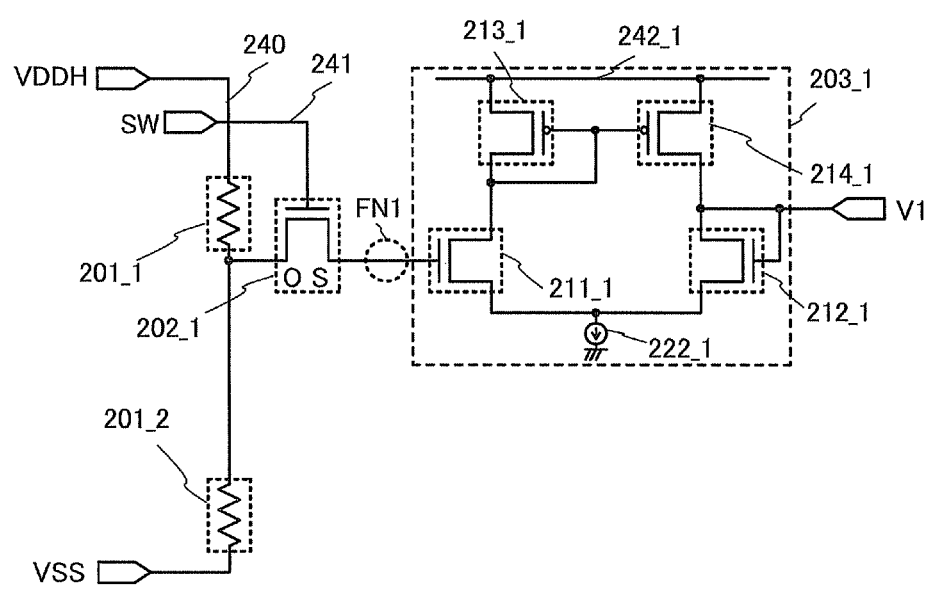
FIG. 1 is a circuit diagram illustrating one mode of a semiconductor device.

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Further, the invention disclosed in this specification is not construed as being limited to the description of the following embodiments. Note that the ordinal numbers such as "first" and "second" are used for convenience and do not denote the order of steps or the stacking order of layers. In addition, the ordinal numbers in this specification do not denote particular names which specify the present invention. Note that the position, the size, the range, or the like of each structure illustrated in drawings and the like is not accurately represented in some cases for easy understanding. Therefore, the disclosed invention is not necessarily limited to the position, the size, the range, or the like disclosed in the drawings and the like.

Embodiment 1

In this embodiment, a circuit configuration of a semiconductor device according to one embodiment of the disclosed invention and a driving method thereof will be described with reference to FIG. 1, FIG. 2, FIG. 3, FIGS. 6A and 6B, FIGS. 7A and 7B, and FIG. 8.

Note that in circuit diagrams in this specification, a transistor including an oxide semiconductor layer is denoted by the symbol "OS" in order to be identified as a transistor including an oxide semiconductor layer. In FIG. 1, FIG. 2, FIG. 3, FIGS. 6A and 6B, and FIGS. 7A and 7B, a switch transistor 202_1, a switch transistor 202_2, a switch transistor 202_n, and a transistor 204 are each a transistor including an oxide semiconductor layer.

FIG. 1 illustrates an example of a semiconductor device having a potential divider circuit which outputs a potential V1 with use of two resistors, a resistor 201_1 and a resistor 201_2.

The semiconductor device illustrated in FIG. 1 has the potential divider circuit which has a power supply line 240 to which the resistor (first resistor) 201_1 and the resistor (second resistor) 201_2 are connected in series, a selection line 241, a switch transistor 202_1 including an oxide semiconductor layer and a gate terminal that is electrically connected to the selection line 241, and an operational amplifier circuit 203_1 including a transistor 211_1 electrically connected to the power supply line 240 through the switch transistor 202_1. The resistor 201_1 and the resistor 201_2 are electrically connected to a source terminal of the switch transistor 202_1. A drain terminal of the switch transistor 202_1 is electrically connected to a gate terminal of the transistor 211_1 included in the operational amplifier circuit 203_1.

The operational amplifier circuit 203_1 includes a differential input circuit having the transistor (first transistor) 211_1 and a transistor (second transistor) 212_1, a current mirror circuit having a transistor (third transistor) 213_1 and a transistor (fourth transistor) 214_1, and a constant current source 222_1.

A source terminal (first source terminal) of the transistor 211_1 and a source terminal (second source terminal) of the transistor 212_1 are electrically connected to the constant current source 222_1. A source terminal (third source terminal) of the transistor 213_1 is electrically connected to a source terminal (fourth source terminal) of the transistor 214_1. A drain terminal (first drain terminal) of the transistor 211_1 and a drain terminal (third drain terminal) of the transistor 213_1 are electrically connected to a gate terminal (third gate terminal) of the third transistor 213_1 and a gate terminal (fourth gate terminal) of the transistor 214_1. A gate terminal (second gate terminal) of the transistor 212_1 and a drain terminal (second drain terminal) of the transistor 212_1 are electrically connected to a drain terminal (fourth drain terminal) of the transistor 214_1. Note that the source terminal (third source terminal) of the transistor 213_1 and the source terminal (fourth source terminal) of the transistor 214_1 are electrically connected to a power supply line 242_1 to which a high potential VDD is supplied.

In the potential divider circuit of the semiconductor device illustrated in FIG. 1, a potential supplied to the power supply line 240 is resistively divided by the resistor 201_1 and the resistor 201_2 connected in series to the power supply line 240, so that the desired potential V1 is output through the switch transistor 202_1 electrically connected to the power supply line 240, as will be explained later.

Figure 2:
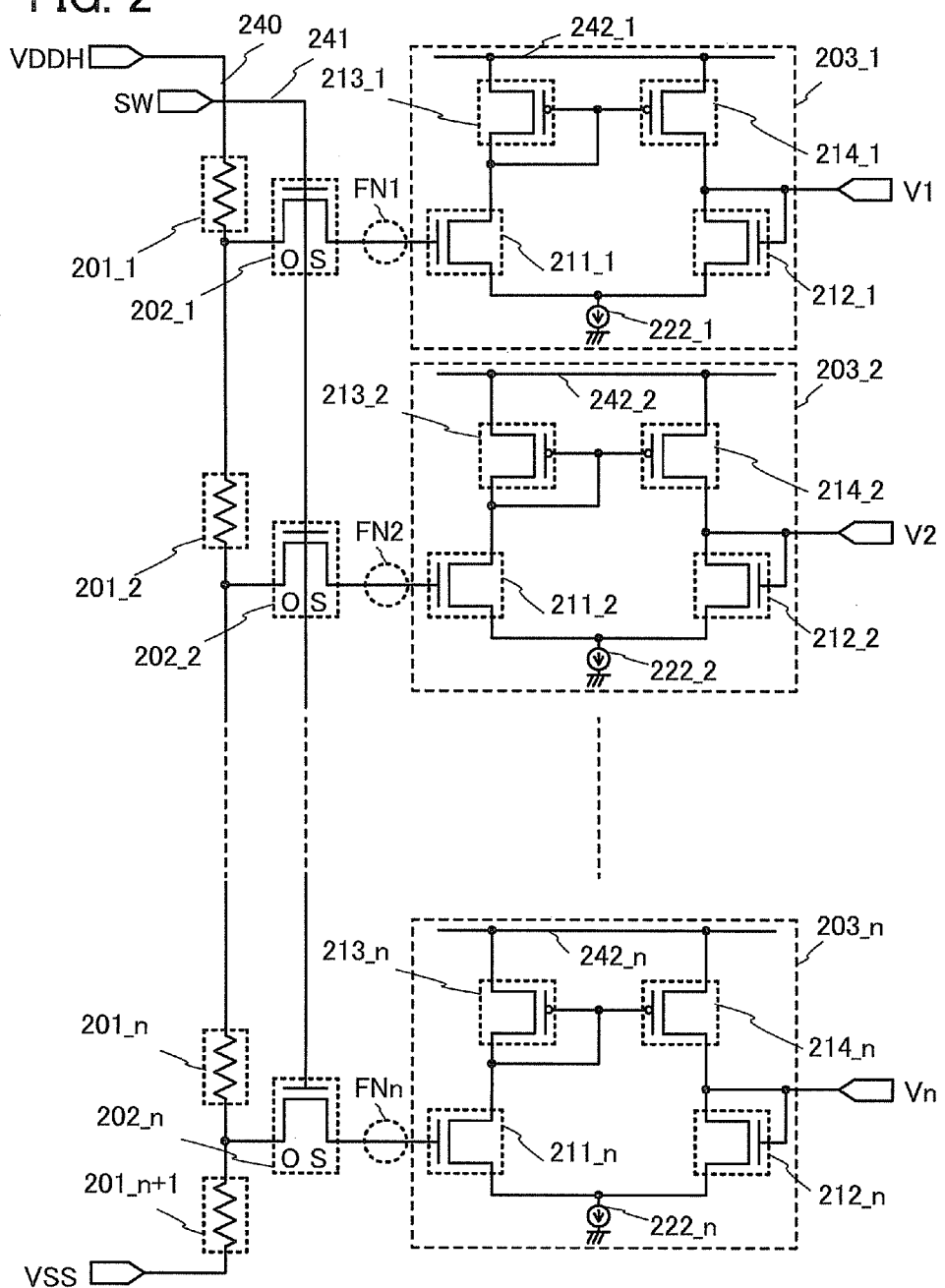
FIG. 2 is a circuit diagram illustrating one mode of a semiconductor device.

FIG. 2 illustrates an example where the semiconductor device in FIG. 1 includes a potential divider circuit in which a high potential (VDDH) supplied to the power supply line 240 is divided by n+1 resistors, i.e., resistors 201_1 to 201_n+1, so that n potentials, V1 to Vn, are output.

Through the switch transistor 202_2 including an oxide semiconductor layer, the potential determined by a voltage drop in the resistor 201_1 and the resistor 201_2 is output as a potential V2 from an operational amplifier circuit 203_2 which includes a differential input circuit having a transistor (first transistor) 211_2 and a transistor (second transistor) 212_2, a current mirror circuit having a transistor (third transistor) 213_2 and a transistor (fourth transistor) 214_2, and a constant current source 222_2.

In the same way, through a switch transistor 202_n including an oxide semiconductor layer, the potential determined by a voltage drop in the resistors 201_1 to 201_n is output as a potential Vn from an operational amplifier circuit 203_n which includes a differential input circuit having a transistor (first transistor) 211_n and a transistor (second transistor) 212_n, a current mirror circuit having a transistor (third transistor) 213_n and a transistor (fourth transistor) 214_n, and a constant current source 222_n.

In this specification, floating nodes (nodes FN1 to FNn) refers to portions at which drain terminals of the switch transistors 202_1 to 202_n are, respectively, electrically connected to gate terminals of the transistors 211_1 to 211_n.

Note that, in the invention disclosed in this specification, a potential VDD higher than the potential of the node FN1 is supplied to the power supply line 242_1.

When the switch transistors 202_1 to 202_n are turned off, the nodes FN1 to FNn can each be regarded as being embedded in an insulator, and thus potentials are held in the nodes FN1 to FNn. Since the off-state current of each of the switch transistors 202_1 to 202_n including an oxide semiconductor layer is less than or equal to one hundred thousandth of that of a transistor including a silicon semiconductor or the like (e.g., the off-state current of each switch transistor is less than or equal to 10 zA (1 zA (zeptoampere) is $1 \times 10^{-21}$ A) at room temperature (25° C.)), a reduction in the potentials held in the nodes FN1 to FNn due to leakage through the switch transistors 202_1 to 202_n is almost negligible. In other words, with the switch transistors 202_1 to 202_n each including an oxide semiconductor layer, the potentials can be held for a long time.

Thus, for the semiconductor device, continuous supply of a potential VDDH to the power supply line 240 is not necessarily performed, and a period for interruption of the supply of a potential VDDH to the power supply line 240 can be provided; consequently, the power consumption can be reduced.

Figure 3:
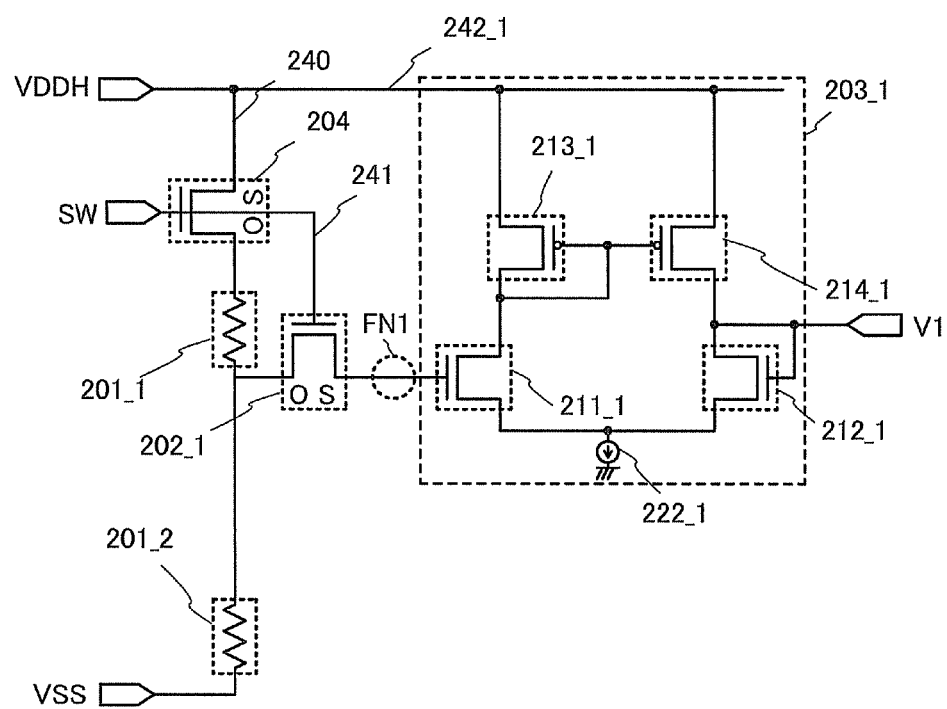
FIG. 3 is a circuit diagram illustrating one mode of a semiconductor device.

Further, as illustrated in FIG. 3, the power supply line 240 may have the transistor 204 including an oxide semiconductor layer so that a potential supplied to the power supply line 240 can be supplied to the resistor 201_1 and the resistor 201_2 through the transistor 204 including an oxide semiconductor layer. A configuration in which a gate terminal of the transistor 204 including an oxide semiconductor layer which is connected to the power supply line 240 is electrically connected to a gate terminal of the switch transistor 202_1 can be formed.

With the transistor 204 including an oxide semiconductor layer which is connected to the power supply line 240, supply of a potential to the resistor 201_1 and the resistor 201_2 can be controlled. For example, after potential supply to the node FN1, potential supply to the power supply line 240 can be interrupted with the transistor 204 including an oxide semiconductor layer turned off in a period in which the potential is held in the node FN1 with the switch transistor 202_1 turned off. In the configuration illustrated in FIG. 3, potential supply to the power supply line 242_1 is possible even in the period for interruption of the potential supply to the power supply line 240.

Figure 8:
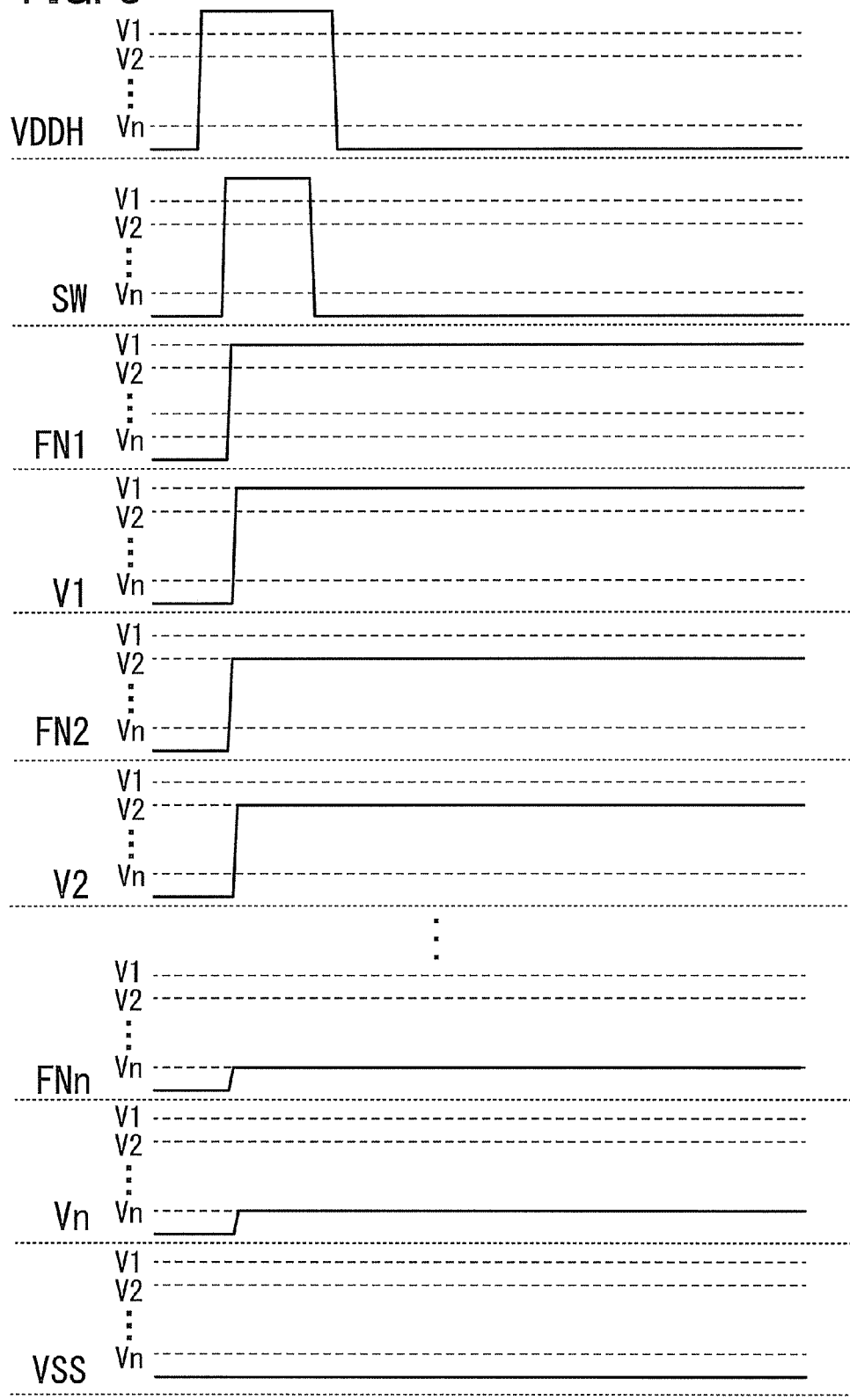
FIG. 8 is a timing chart illustrating one mode of a semiconductor device.

A driving method (operation) of the semiconductor device illustrated in FIG. 2 will be described in more detail using a timing chart in FIG. 8. The timing chart shares the terms, such as VDDH, SW, and FN1, with FIG. 2.

In the description of the operation of the semiconductor device, it is assumed that the transistors 211_1 to 211_n, 212_1 to 212_n, 213_1 to 213_n, and 214_1 to 214_n included in the operational amplifier circuits 203_1 to 203_n have the same channel width and channel length and the characteristics of the transistors are the same.

By application of a potential to the power supply line 240 and VSS, a current flows between the power supply line 240 and VSS. For example, the potential of the source terminal of the switch transistor 202_1 is the potential determined by a voltage drop from the potential of the power supply line 240 equal to the voltage calculated using the resistance of the resistor 201_1 and the current flowing between the power supply line 240 and VSS. A selection line SW is electrically connected to gate terminals of the switch transistors 202_1 to 202_n. When a voltage is applied to the selection line SW so that a source and drain terminals of each of the switch transistors 202_1 to 202_n have electrical continuity (are in an on state), a potential is supplied to each of the drain terminals of the switch transistors 202_1 to 202_n (FN1 to FNn). At the time when the potential of each of the drain terminals (FN1 to FNn) is stabilized, a voltage is applied to the selection line SW so that the source and drain terminals of each of the switch transistors 202_1 to 202_n are electrically disconnected (off state of the switch transistors).

The potential of FN1 is applied to the gate terminal of the transistor 211_1 included in the operational amplifier circuit 203_1. In addition, a current corresponding to a difference between the potential FN1 of the gate terminal and the potential of the source terminal flows from the drain terminal to the source terminal in the transistor 211_1. The transistor 213_1 and the transistor 211_1 are connected to the power supply line 242_1 and GND through the constant current source 222_1; therefore, the =Tent flowing from the drain terminal to the source terminal in the transistor 211_1 is the same as a current flowing from the source terminal to the drain terminal in the transistor 213_1.

Further, the gate and drain terminals of the transistor 213_1 are electrically connected to the gate terminal of the transistor 214_1, and, further, the source terminal of each transistor is also connected to the power supply line 242_1; therefore, the current flowing from the source terminal to the drain terminal in the transistor 213_1 is the same as a current flowing from the source terminal to the drain terminal in the transistor 214_1 (current mirror circuit). Note that for the same reason as in the above-described relationship between the transistor 213_1 and the transistor 211_1, the current flowing from the source terminal to the drain terminal in the transistor 214_1 is the same as a current flowing from the drain terminal to the source terminal in the transistor 212_1.

The current flowing from the drain terminal to the source terminal in the transistor 211_1 is therefore the same as the current flowing from the drain terminal to the source terminal in the transistor 212_1, and the source terminal of the transistor 211_1 and the source terminal of the transistor 212_1 are electrically connected to the constant current source 211_1. Consequently, the potential of the gate terminal of the transistor 211_1 is the same as the potential of the gate terminal of the transistor 212_1. Since the potential of the gate terminal of the transistor 211_1 is FN1, the potential of the gate terminal of the transistor 212_1 is FN1; thus, the potential of V1 is FN1.

In the same way, a potential determined by a voltage drop in the resistor 201_1 and the resistor 201_2 is supplied to FN2 and output as V2. The potential supplied from VDDH and determined by a voltage drop in the interposed resistors is successively supplied to one of FN3 to FNn and output as the corresponding one of V3 to Vn Other modes of a semiconductor device having a potential divider circuit are illustrated in FIGS. 6A and 6B and FIGS. 7A and 7B. FIGS. 6A and 6B and FIGS. 7A and 7B correspond to, but not limited to, FIG. 1 and can also have a configuration corresponding to that in FIG. 3.

Figure 6A:
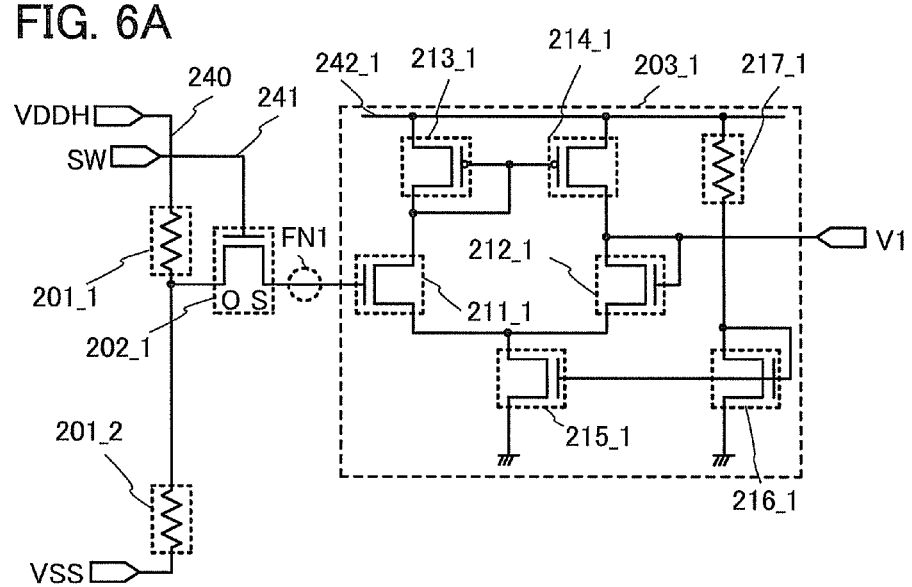
FIGS. 6A and 6B are circuit diagrams each illustrating one mode of a semiconductor device.

FIG. 6A illustrates a configuration in which the constant current source 222_1 in FIG. 1 is fabricated with a resistor 217_1, a transistor 215_1, and a transistor 216_1. The transistor 216_1 and the transistor 215_1 form a current mirror circuit, and the same current flows through the transistor 215_1 and the transistor 216_1. Note that the transistor 215_1 and the transistor 216_1 have the same channel width and channel length and the characteristics of the transistors are the same.

Figure 6B:
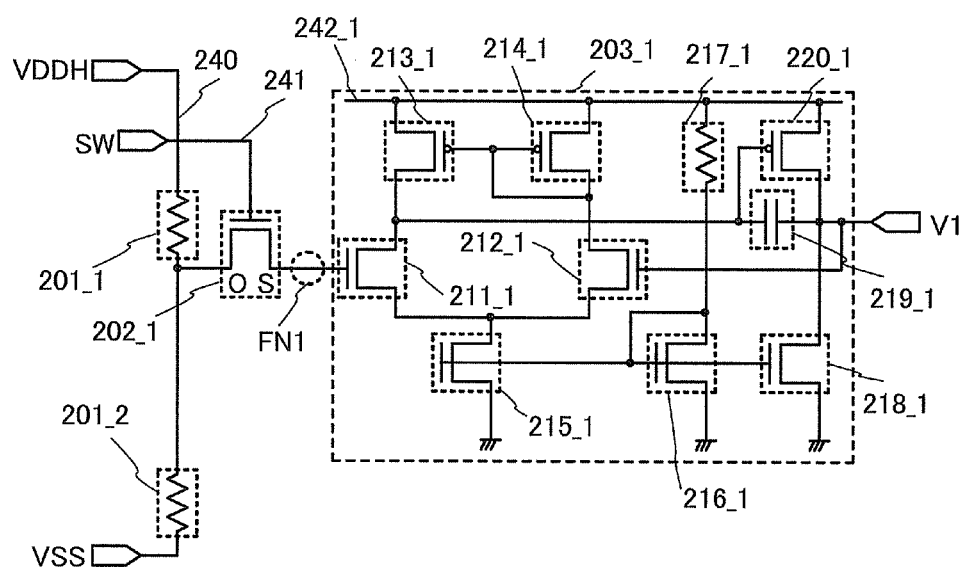

FIG. 6B illustrates a configuration in which an amplifier circuit including a transistor 220_1, a transistor 218_1, and a capacitor 219_1 is added to the configuration in FIG. 6A. The capacitor 219_1 used in the amplifier circuit is referred to as a capacitor for phase compensation, and is connected so as to prevent the operational amplifier circuit 203_1 from oscillating.

Figure 7A:
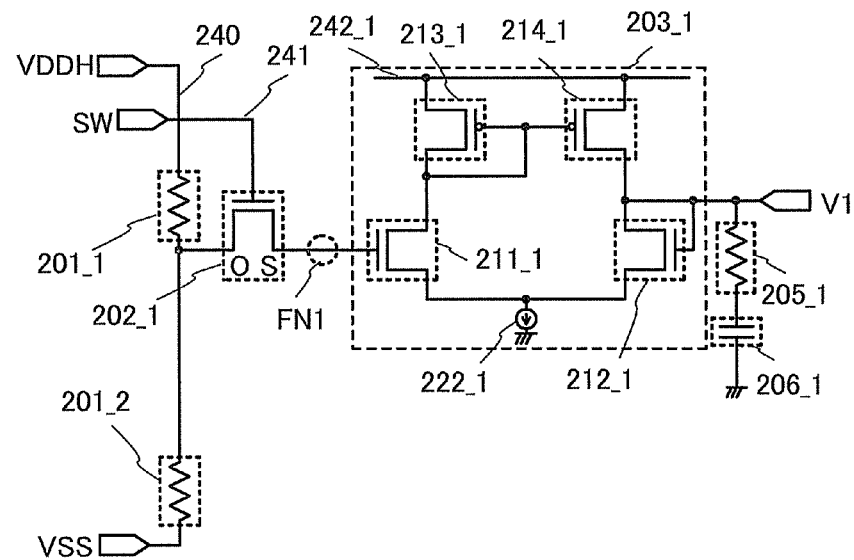
FIGS. 7A and 7B are circuit diagrams each illustrating one mode of a semiconductor device.
Figure 7B:
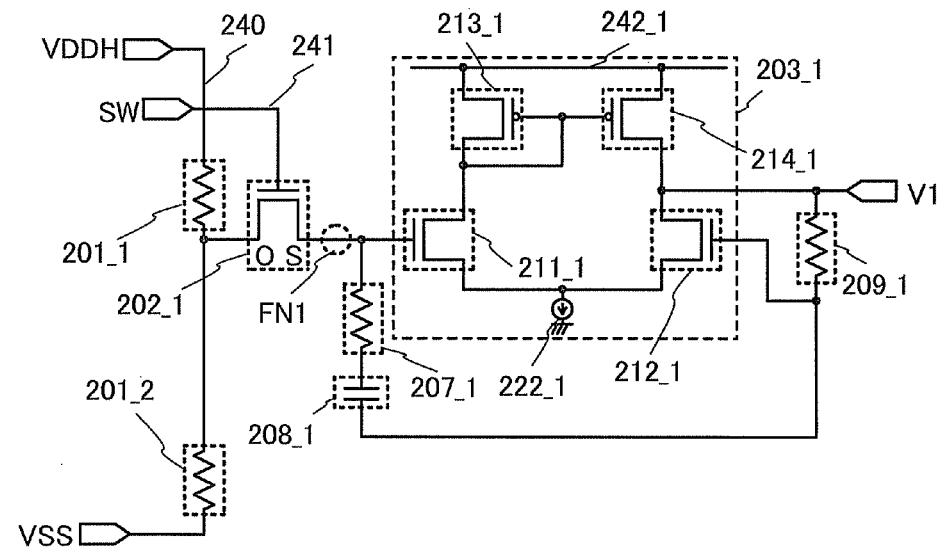

FIGS. 7A and 7B illustrate examples for phase compensation and gain adjustment for preventing the operational amplifier circuit 203_1 from oscillating: a resistor 205_1 and a capacitor 206_1 are introduced in the example in FIG. 7A, and a resistor 207_1, a resistor 209_1, and a capacitor 208_1 are introduced in the example in FIG. 7B.

For the operational amplifier circuit of a semiconductor device disclosed in this specification, a transistor using a material other than an oxide semiconductor can be used. A transistor including a material other than an oxide semiconductor is capable of sufficiently high-speed operation, and accordingly, use of this in combination with the transistor including an oxide semiconductor layer sufficiently ensures high-speed performance in operation of the semiconductor device. Further, the use of a transistor including a material other than an oxide semiconductor can suitably realize a variety of circuits (e.g., a logic circuit or a driver circuit) for which high speed operation is required.

Thus, a semiconductor device having a novel feature can be realized by provision of both the transistor including a material other than an oxide semiconductor (more broadly, a transistor capable of sufficiently high-speed operation) and the transistor including an oxide semiconductor (more broadly, a transistor with a sufficiently small off-state current).

In the semiconductor device having the potential divider circuit in which a potential supplied to a power supply line is resistively divided by a plurality of resistors connected in series to the power supply line so that a desired potential is output through a switch transistor electrically connected to the power supply line, a drain terminal of the switch transistor and a gate terminal of a transistor provided in an operational amplifier circuit on the output side are electrically connected to form a node.

By being held in the node, the desired potential can be output even when potential supply from the power supply line is interrupted.

Thus, continuous potential supply to the power supply line is not necessarily performed, and a period for interruption of the potential supply to the power supply line can be provided; consequently, it is possible to reduce the power consumption of the semiconductor device or in a method of driving the semiconductor device.

Since the off-state current of a transistor including an oxide semiconductor layer which is used for the switch transistor is extremely low, a potential can be held for a long time. Consequently, a period for interruption of potential supply can be provided, and the power consumption can be sufficiently reduced as compared to the case where a potential is constantly supplied.

The structure and method described above in this embodiment or the like can be combined as appropriate with any of the methods and structures described in the other embodiments.

Embodiment 2

In this embodiment, a circuit configuration of a semiconductor device according to another embodiment of the disclosed invention and a driving method thereof will be described with reference to FIG. 4 and FIG. 5.

Figure 4:
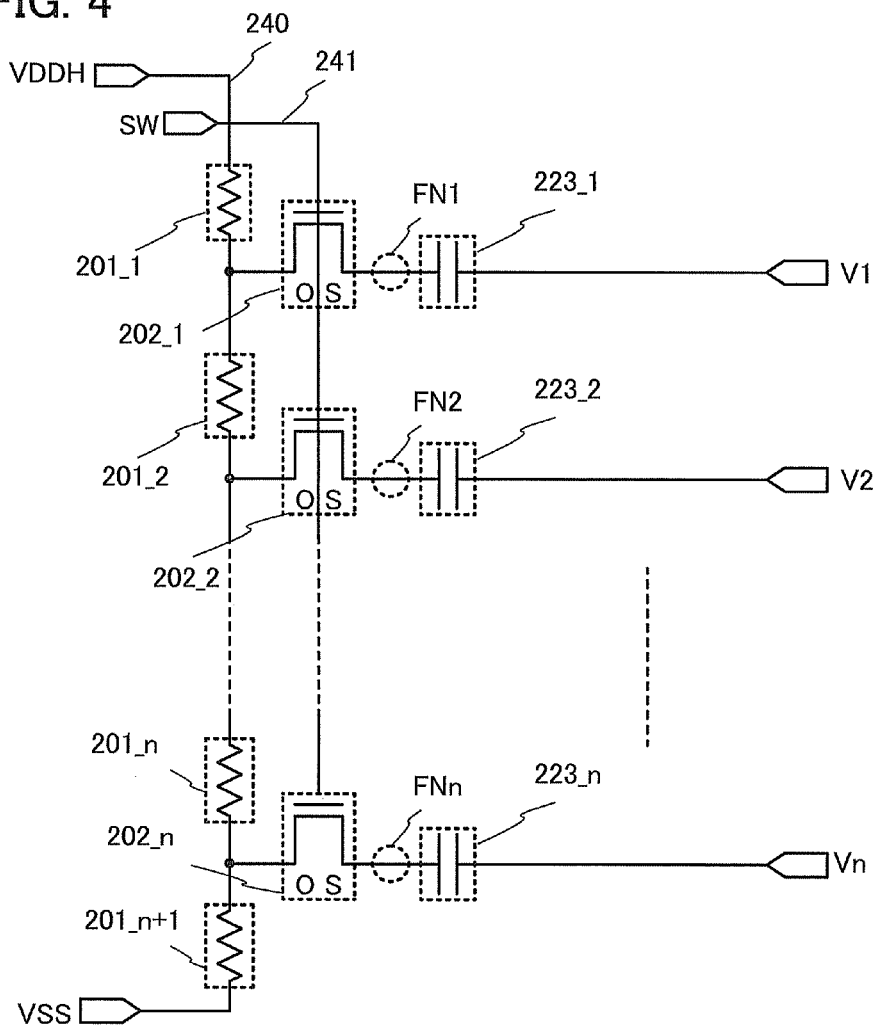
FIG. 4 is a circuit diagram illustrating one mode of a semiconductor device.
Figure 5:
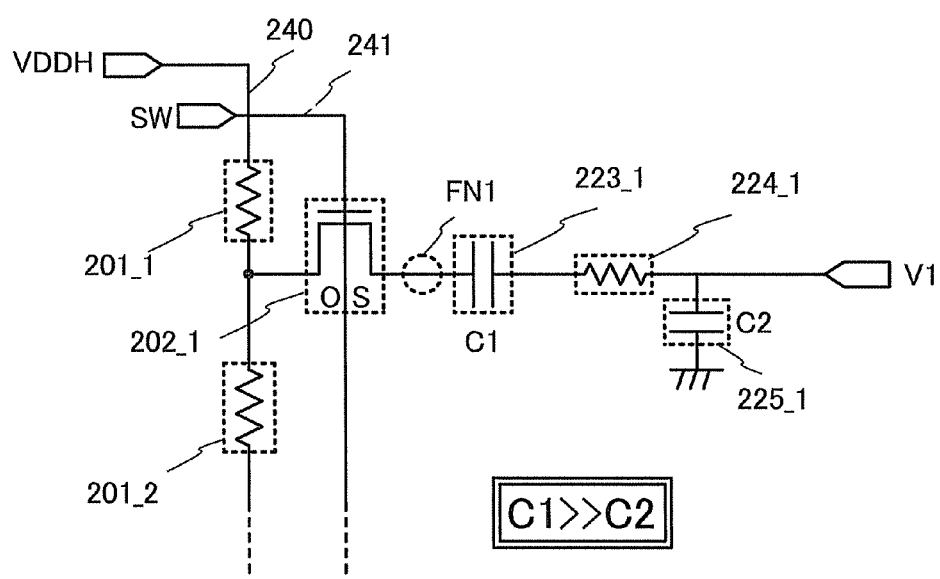
FIG. 5 is a circuit diagram illustrating one mode of a semiconductor device.

FIG. 4 and FIG. 5 each illustrate an example where the semiconductor device in FIG. 2 described in Embodiment 1 is provided with a capacitor instead of the operational amplifier circuit. Components having the functions that are identical or similar to those in Embodiment 1 are the same as in Embodiment 1, and repeated description is omitted. In addition, detailed description of the same portions is omitted.

FIG. 4 illustrates an example where the semiconductor device includes a potential divider circuit in which a high potential (VDDH) supplied to the power supply line 240 is divided by n+1 resistors, the resistors 201_1 to 201_$n$+1, so that n potentials, V1 to Vn, are output.

The semiconductor device has the potential divider circuit which has the power supply line 240 to which the resistors 201_1 to 201_$n$+1 are connected in series, the selection line 241, the switch transistors 202_1 to 202_$n$ each including an oxide semiconductor layer and a gate terminal that is electrically connected to the selection line 241, and capacitors 223_1 to 223_$n$ electrically connected, respectively, through the switch transistors 202_1 to 202_$n$ to the power supply line 240. The resistors 201_1 to 201_$n$+1 are electrically connected to the source terminals of the switch transistors 202_1 to 202_$n$. The drain terminals of the switch transistors 202_1 to 202_$n$ are electrically connected to terminals on one side of the capacitors 223_1 to 223_$n$.

In this embodiment, the drain terminals of the switch transistors 202_1 to 202_$n$ and the terminals on one side of the capacitors 223_1 to 223_$n$ are electrically connected to form nodes (FN1 to FNn).

With the switch transistors 202_1 to 202_$n$ turned on, the potentials V1 to Vn into which the potential is divided by the resistors 201_1 to 201_$n$+1 are supplied to (stored in) the nodes FN1 to FNn from the power supply line 240. After the supply of the potentials V1 to Vn, the switch transistors 202_1 to 202_$n$ are turned off, and the potentials are held in the nodes FN1 to FNn. By being held in the nodes FN1 to FNn, the potentials V1 to Vn can be output even when potential supply from the power supply line 240 is interrupted.

Note that in the configuration in this embodiment, as illustrated in FIG. 5, a resistor 224_1 due to a wiring or the like is formed more on the output side than the capacitor 223_1 and a capacitor 225_1 is inevitably loaded. In order that the potentials V1 to Vn be held in the nodes (FN1 to FNn) formed by the electrical connection between the drain terminals of the switch transistors 202_1 to 202_$n$ and the terminals on one side of the capacitors 223_1 to 223_$n$, the capacitance C1 of the capacitor 223_1 is required to be sufficiently larger than the capacitance C2 of the capacitor 225_1 which is parasitic capacitance.

Further, also in the configuration in this embodiment in FIG. 4, as illustrated in FIG. 3, the power supply line 240 may have the transistor 204 including an oxide semiconductor layer, so that a potential supplied to the power supply line 240 may be supplied to the resistors 201_1 to 201_$n$+1 through the transistor 204 including an oxide semiconductor layer. In addition, a configuration in which the gate terminal of the transistor 204 including an oxide semiconductor layer which is connected to the power supply line 240 is electrically connected to the gate terminals of the switch transistors 202_1 to 202_$n$ can be formed.

With the transistor 204 including an oxide semiconductor layer which is connected to the power supply line 240, supply of a potential to the resistors 201_1 to 201_$n$+1 can be controlled. For example, after potential supply to the nodes FN1 to FNn, potential supply to the power supply line 240 can be interrupted with the transistor 204 including an oxide semiconductor layer turned off in a period in which the potentials are held in the nodes FN1 to FNn with the switch transistors 202_1 to 202_$n$ turned off.

Note that in the semiconductor device of this embodiment, V1 to Vn are floating in the initial state and the potentials are variable. Although not illustrated in FIG. 4, drain terminals of switch transistors A1 to An each including an oxide semiconductor layer are electrically connected to ends of the capacitors 223_1 to 223_$n$ on the output side, i.e., ends of wirings to which V1 to Vn are supplied. Gate terminals of the switch transistors A1 to An are each connected to a control line, and the source terminals thereof are each connected to VSS. In addition, the control line is controlled to control the gate terminals of the switch transistors A1 to An each including an oxide semiconductor layer, the switch transistors A1 to An have electrical continuity, so that the wirings to which V1 to Vn are supplied are at the same potential as VSS. After the wirings to which V1 to Vn are supplied are at the same potential as VSS, the control line is again controlled to control the gate terminals of the switch transistors A1 to An each including an oxide semiconductor layer, so that the switch transistors A1 to An have no electrical continuity (are turned off). Then, by application of a potential to the selection line SW, the switch transistors 202_1 to 202_$n$ have electrical continuity (are turned on) and the potentials of FN1 to FNn are fixed, so that V1 to Vn are supplied through the capacitors 223_1 to 223_$n$ to the wirings.

As described above, by being held in the nodes FN1 to FNn, the desired potentials V1 to Vn can be output even if potential supply from the power supply line 240 is interrupted.

Thus, continuous supply of a potential to the power supply line 240 is not necessarily performed, and a period for interruption of the potential supply to the power supply line can be provided; consequently, it is possible to reduce the power consumption of the semiconductor device or in the method of driving the semiconductor device.

Since the off-state current of a transistor including an oxide semiconductor layer which is used for the switch transistor is extremely low, a potential can be held for a long time. Consequently, a period for interruption of potential supply can be provided, and the power consumption can be sufficiently reduced as compared to the case where a potential is constantly supplied.

The structure and method described above in this embodiment or the like can be combined as appropriate with any of the methods and structures described in the other embodiments.

Embodiment 3

In this embodiment, a circuit configuration of a semiconductor device according to another embodiment of the disclosed invention and a driving method thereof will be described with reference to FIG. 9.

Figure 9:
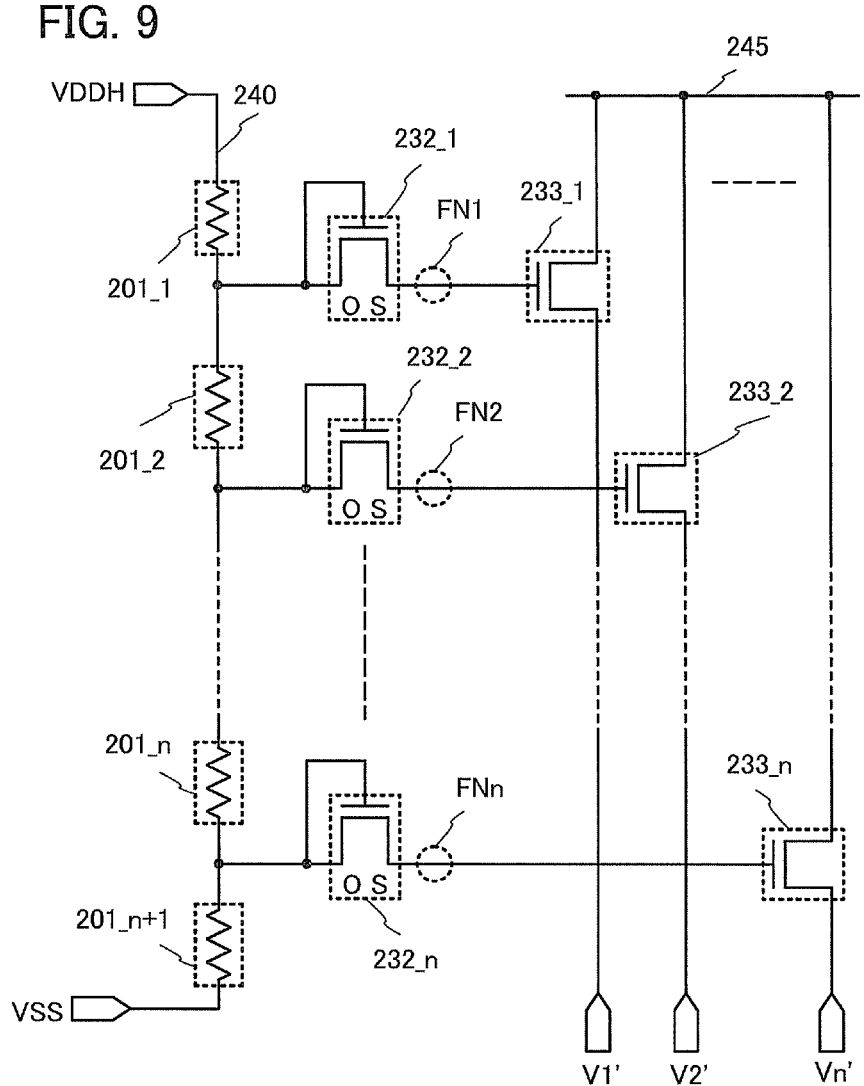
FIG. 9 is a circuit diagram illustrating one mode of a semiconductor device.

FIG. 9 illustrates an example where the semiconductor device in FIG. 2 described in Embodiment 1 includes a transistor whose gate and source terminals are electrically connected, instead of the switch transistor whose on/off is controlled with the selection line. Components having the functions that are identical or similar to those in Embodiment 1 are the same as in Embodiment 1, and repeated description is omitted. In addition, detailed description of the same portions is omitted.

FIG. 9 illustrates an example where the semiconductor device includes a potential divider circuit in which a high potential (VDDH) supplied to the power supply line 240 is divided by n+1 resistors, the resistors 201_1 to 201_$n$+1, so that the divided potentials are used to output n potentials, V1' to Vn', from a power supply line 245.

The semiconductor device has the potential divider circuit having transistors 232_1 to 232_$n$ in each of which an oxide semiconductor layer is included and a gate terminal is electrically connected to the power supply line 240 to which the resistors 201_1 to 201_$n$+1 are connected in series and is electrically connected to a source terminal, and transistors 233_1 to 233_$n$ electrically connected, respectively, through the transistors 232_1 to 232_$n$ to the power supply line 240. The resistors 201_1 to 201_$n$+1 are electrically connected to source terminals of the transistors 232_1 to 232_$n$. Drain terminals of the transistors 232_1 to 232_$n$ are electrically connected to gate terminals of the transistors 233_1 to 233_$n$. Note that the transistors 233_1 to 233_$n$ are electrically connected to the power supply line 245.

In this embodiment, the drain terminals of the transistors 232_1 to 232_$n$ and the gate terminals of the transistors 233_1 to 233_$n$ are electrically connected to form nodes (FN1 to FNn).

With the transistors 232_1 to 232_$n$ turned on, the desired potentials into which the potential is divided by the resistors 201_1 to 201_$n$+1 are supplied to (stored in) the nodes FN1 to FNn from the power supply line 240. After the supply of the desired potentials, the transistors 232_1 to 232_$n$ are turned off, and the potentials are held in the nodes FN1 to FNn. By being held in the nodes FN1 to FNn, the desired potentials can be supplied to the gate terminals of the transistors 233_1 to 233_$n$, so that the potentials V1' to Vn' can be output from the power supply line 245, even when potential supply from the power supply line 240 is interrupted.

Further, also in the configuration in this embodiment in FIG. 9, as illustrated in FIG. 3, the power supply line 240 may have the transistor 204 including an oxide semiconductor layer, so that a potential supplied to the power supply line 240 may be supplied to the resistors 201_1 to 201_$n$+1 through the transistor 204 including an oxide semiconductor layer.

With the transistor 204 including an oxide semiconductor layer which is connected to the power supply line 240, supply of a potential to the resistors 201_1 to 201_$n$+1 can be controlled. For example, after potential supply to the nodes FN1 to FNn, potential supply to the power supply line 240 can be interrupted with the transistor 204 including an oxide semiconductor layer turned off in a period in which the potentials are held in the nodes FN1 to FNn with the transistors 232_1 to 232_n turned off.

As described above, by being held in the nodes FN1 to FNn, the desired potentials V1' to Vn' can be output even when potential supply from the power supply line 240 is interrupted.

Thus, continuous supply of a potential to the power supply line 240 is not necessarily performed, and a period for interruption of the potential supply to the power supply line can be provided; consequently, it is possible to reduce the power consumption of the semiconductor device or in the method of driving the semiconductor device.

Since the off-state current of a transistor including an oxide semiconductor layer which is used for the transistors 232_1 to 232_n is extremely low, a potential can be held for a long time. Consequently, a period for interruption of potential supply can be provided, and the power consumption can be sufficiently reduced as compared to the case where a potential is constantly supplied.

The structure and method described above in this embodiment or the like can be combined as appropriate with any of the methods and structures described in the other embodiments.

Embodiment 4

In this embodiment, a circuit configuration of a semiconductor device according to one embodiment of the disclosed invention and a fabrication method thereof will be described with reference to FIGS. 10A and 10B, FIGS. 11A to 11E, and FIGS. 12A to 12D.

Figure 10A:
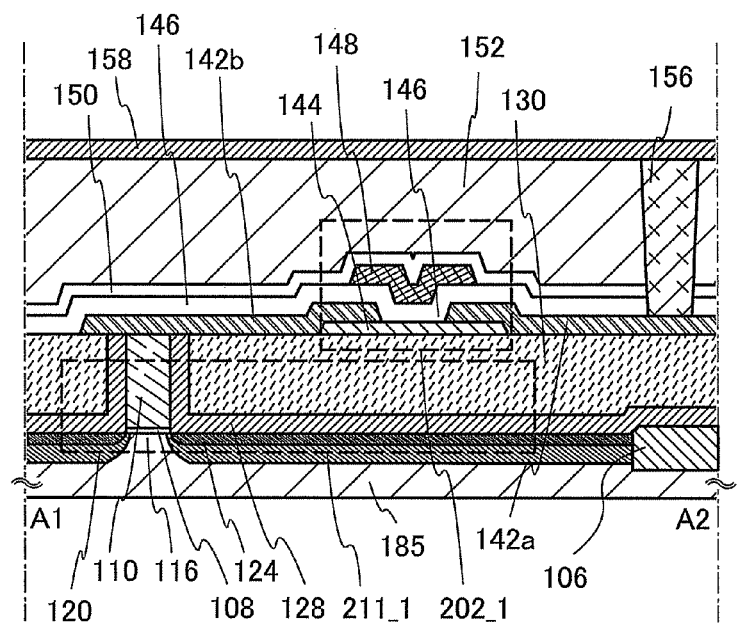
FIGS. 10A and 10B are a cross-sectional and plan views illustrating one mode of a semiconductor device.
Figure 10B:
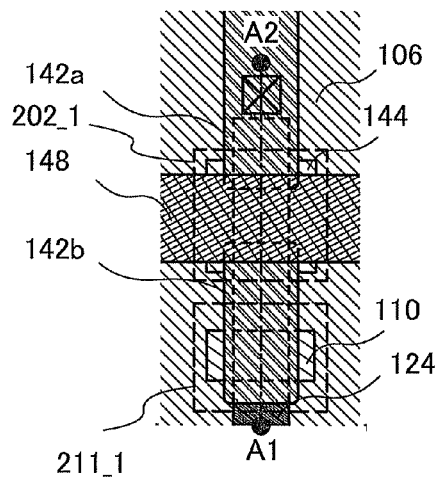

FIGS. 10A and 10B illustrate a structural example of the semiconductor device having the potential divider circuit illustrated in the circuit diagram of FIG. 1. FIG. 10A illustrates a cross section of the semiconductor device, and FIG. 10B illustrates a plane of the semiconductor device. FIG. 10A is a cross-sectional view taken along A1-A2 in FIG. 10B. Note that in the plan view in FIG. 10B, an insulating layer 150, an insulating layer 152, and a wiring 158 are omitted for simplification of the figure.

The semiconductor device illustrated in FIGS. 10A and 10B has the transistor 211_1 including a first semiconductor material in the lower portion and the switch transistor 202_1 including a second semiconductor material in the upper portion.

Here, the first semiconductor material is preferably different from the second semiconductor material. In this embodiment, the first semiconductor material is a semiconductor material (e.g., silicon) other than an oxide semiconductor and the second semiconductor material is an oxide semiconductor. A transistor including a material other than an oxide semiconductor can operate at high speed easily. On the other hand, a transistor including an oxide semiconductor can hold a potential for a long time owing to its characteristics.

The transistor 211_1 illustrated in FIGS. 10A and 10B includes a channel formation region 116 provided in a substrate 185 including a semiconductor material (e.g., silicon), impurity regions 120 with the channel formation region 116 interposed therebetween, metal compound regions 124 in contact with the impurity regions 120, a gate insulating layer 108 provided over the channel formation region 116, and a gate electrode 110 provided over the gate insulating layer 108. Note that a transistor whose source and drain electrodes are not explicitly illustrated in a drawing can be referred to as a transistor for the sake of convenience. Further, in such a case, for description of connection relationship with the transistor, a source region and a source electrode might be collectively referred to as a "source electrode", and a drain region and a drain electrode might be collectively referred to as a "drain electrode". That is, in this specification, the term "source electrode" can include a source region and the term "drain electrode" can include a drain region.

Further, an element isolation insulating layer 106 is provided over the substrate 100 so as to surround the transistor 211_1, and an insulating layer 128 and an insulating layer 130 are provided so as to cover the transistor 211_1. Note that in order to realize higher integration, the transistor 211_1 preferably has a structure without a sidewall insulating layer as illustrated in FIGS. 10A and 10B. On the other hand, when importance is put on the characteristics of the transistor 211_1, sidewall insulating layers may be provided on side surfaces of the gate electrode 110 to provide the impurity regions 120 including regions with different impurity concentrations.

Here, the insulating layer 130 preferably has a surface having good planarity.

The switch transistor 202_1 in FIGS. 10A and 10B has an oxide semiconductor layer 144 formed over the insulating layer 130, a source electrode 142a, a drain electrode 142b, a gate insulating layer 146 covering the oxide semiconductor layer 144, the source electrode 142a, and the drain electrode 142b, and a gate electrode 148 which is provided so as to overlap with the oxide semiconductor layer 144 over the gate insulating layer 146. Note that the gate electrode 148 is electrically connected to the selection line 241 in the circuit diagram illustrated in FIG. 1.

The drain electrode 142b is formed in contact with the gate electrode 110 of the transistor 211_1. The drain electrode 142b of the switch transistor 202_1 and the gate electrode 110 of the transistor 211_1 are electrically connected to form a node (FN1).

Here, the oxide semiconductor layer 144 is preferably highly purified by sufficient removal of impurities such as hydrogen therefrom or by sufficient supply of oxygen thereinto. Specifically, the hydrogen concentration in the oxide semiconductor layer 144 is $5 \times 10^{19}$ atoms/cm$^3$ or less, preferably $5 \times 10^{18}$ atoms/cm$^3$ or less, more preferably $5 \times 10^{17}$ atoms/cm$^3$ or less.

Note that the above-described hydrogen concentration in the oxide semiconductor layer 144 is measured by secondary ion mass spectrometry (SIMS). The density of carriers due to a donor such as hydrogen in the oxide semiconductor layer 144, in which the hydrogen concentration is sufficiently reduced and in which defect levels in the energy gap due to oxygen deficiency are reduced by sufficient supply of oxygen as described above, is less than $1 \times 10^{12}$/cm$^3$, desirably less than $1 \times 10^{11}$/cm$^3$, more desirably less than $1.45 \times 10^{10}$/cm$^3$. In addition, for example, the off-state current (per unit channel width (1 μm) here) at room temperature (25° C.) is 100 zA or less (1 zA (zeptoampere) is $1 \times 10^{-21}$ A), preferably 10 zA or less. By using such an i-type (intrinsic) oxide semiconductor or a substantially i-type oxide semiconductor, the switch transistor 202_1 which has extremely favorable off-state current characteristics (low off-state current) can be obtained.

Further, for the oxide semiconductor layer 144, minimum values measured by secondary ion mass spectrometry are as follows: the minimum value for sodium (Na) is $5 \times 10^{16}$ cm$^{-3}$ or less, preferably $1 \times 10^{16}$ cm$^{-3}$ or less, further preferably $1 \times 10^{15}$ cm$^{-3}$ or less; the minimum value for lithium (Li) is $5 \times 10^{15}$ cm$^{-3}$ or less, preferably $1 \times 10^{15}$ cm$^{-3}$ or less; and the minimum value for potassium (K) is $5 \times 10^{15}$ cm$^{-3}$ or less, preferably $1 \times 10^{15}$ cm$^{-3}$ or less.

An alkali metal and an alkaline earth metal are bad impurities for the oxide semiconductor layer 144, and it is better that they be contained as few as possible. An alkali metal, and in particular Na becomes Na$^+$ by diffusing into the oxide semiconductor layer 144 when an insulating film in contact therewith is an oxide. Further, Na cuts the bond between a metal and oxygen or enters the bond in the oxide semiconductor layer 144. That results in deterioration of characteristics of the transistor using the oxide semiconductor layer 144 (e.g., an inclination to be normally on (a negative shift in threshold value) or a decrease in mobility). In addition, that also causes variation in the characteristics. Such a problem is significant especially in the case where the hydrogen concentration in the oxide semiconductor layer 144 is sufficiently low. Therefore, in the case where the hydrogen concentration in the oxide semiconductor layer 144 is less than or equal to $5 \times 10^{19}$ cm$^{-3}$, particularly less than or equal to $5 \times 10^{18}$ cm$^{-3}$, the concentration of an alkali metal is strongly required to be set to the above value.

Further, a region that is a surface of the insulating layer 130 and in contact with the oxide semiconductor layer 144 preferably has a root-mean-square (RMS) roughness of 1 nm or less. By provision of a channel formation region of the switch transistor 202_1 in such an extremely planar region having a root-mean-square (RMS) roughness of 1 nm or less, the switch transistor 202_1 in which malfunction such as a short-channel effect is prevented and having good characteristics can be provided even in conditions where the switch transistor 202_1 is miniaturized.

The switch transistor 202_1 and the transistor 211_1 are formed to have a stacked-layer structure, so that the areas they occupy in the semiconductor device can be reduced. Thus, higher integration of the semiconductor device can be achieved.

The insulating layer 150 is provided over the switch transistor 202_1, and the insulating layer 152 is provided over the insulating layer 150. An opening reaching the source electrode 142a is formed in the gate insulating layer 146, the insulating layer 150, and the insulating layer 152. An electrode 156 is formed in the opening. The wiring 158 is formed over the insulating layer 152 to be in contact with the electrode 156 which is formed so as to be embedded in the insulating layer 152, so that the source electrode 142a and the wiring 158 are electrically connected. Here, the wiring 158 is the power supply line 240 or a wiring that is electrically connected to the power supply line 240 in the circuit illustrated in FIG. 1.

Note that the structure of the semiconductor device according to the disclosed invention is not limited to that illustrated in FIGS. 10A and 10B. Since the technical idea of one embodiment of the disclosed invention lies in formation of a stacked-layer structure using an oxide semiconductor and a material other than an oxide semiconductor, details such as connection relationship with an electrode or the like can be modified as appropriate.

Next, an example of a method of fabricating the above semiconductor device will be described. Hereinafter, a method of fabricating the transistor 211_1 in the lower portion will first be described with reference to FIGS. 11A to 11E, and a method of fabricating the switch transistor 202_1 in the upper portion and the capacitor 164 will then be described with reference to FIGS. 12A to 12D and FIGS. 13A to 13D.

Figure 11A:
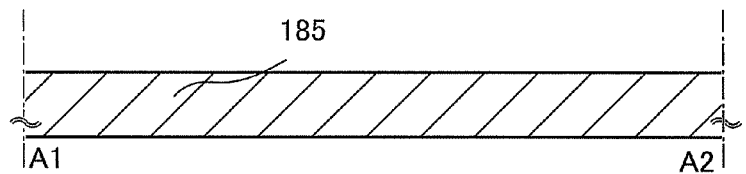
FIGS. 11A to 11E illustrate one mode of a method of fabricating a semiconductor device.

First, the substrate 185 including a semiconductor material is prepared (see FIG. 11A). As the substrate 185 including a semiconductor material, a single crystal semiconductor substrate or a polycrystalline semiconductor substrate of silicon, silicon carbide, or the like, a compound semiconductor substrate of silicon germanium or the like, an SOI substrate, or the like can be used. Here, an example where a single crystal silicon substrate is used as the substrate 185 including a semiconductor material is described. Note that the "SOI substrate" generally refers to a substrate having a structure in which a silicon semiconductor layer is provided on an insulating surface, but is used as the concept also including a substrate having a structure in which a semiconductor layer formed of a material other than silicon is provided on an insulating surface in this specification and the like. That is, a semiconductor layer included in the "SOI substrate" is not limited to a silicon semiconductor layer. Moreover, the SOI substrate includes a substrate having a structure in which a semiconductor layer is provided over an insulating substrate, such as a glass substrate, with an insulating layer interposed therebetween.

As the substrate 185 including a semiconductor material, a single crystal semiconductor substrate of silicon or the like is particularly preferred so that operation of a circuit of the semiconductor device can be speeded up.

Note that an impurity element may be added to a region that later serves as the channel formation region 116 of the transistor 211_1 in order to control the threshold voltage of the transistor. Here, an impurity element imparting conductivity is added so that the threshold voltage of the transistor 211_1 becomes positive. When the semiconductor material is silicon, examples of the impurity imparting conductivity are boron, aluminum, gallium, and the like. Note that after the addition of the impurity element, heat treatment is desirably performed for activation of the impurity element, improvement against defects generated during the addition of the impurity element, or the like.

Figure 11B:
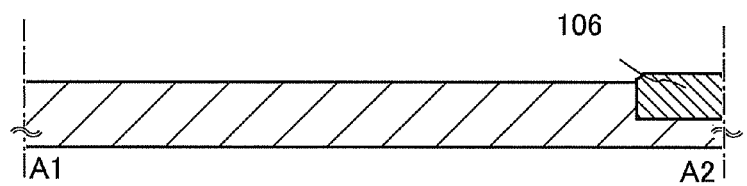

The element isolation insulating layer 106 is formed on the substrate 185 (see FIG. 11B). The element isolation insulating layer 106 can be formed in such a way that the substrate 185 is selectively removed, an insulating layer is formed so as to fill the removed region, and the insulating layer is selectively removed. The insulating layer is formed using silicon oxide, silicon nitride, silicon nitride oxide, or the like. As a method of removing the insulating layer, polishing treatment, such as CMP (chemical mechanical polishing) treatment, etching treatment, and the like can be given, and any of them may be used. Note that the substrate 185 other than a region for formation of the element isolation insulating layer 106 can be used as a semiconductor region.

Next, an insulating layer is formed over a surface of the substrate 185, and a layer containing an electrically conductive material is formed over the insulating layer.

The insulating layer is to be a gate insulating layer later, and can be formed by heat treatment (thermal oxidation treatment, thermal nitridation treatment, or the like) on the surface of the substrate 185, for example. Instead of the heat treatment, high-density plasma treatment may be employed. The high-density plasma treatment can be performed using, for example, a mixed gas of a rare gas such as He, Ar, Kr, or Xe and a gas such as oxygen, nitrogen oxide, ammonia, nitrogen, or hydrogen. Needless to say, the insulating layer may be formed by a CVD method, a sputtering method, or the like. The insulating layer preferably has a single-layer structure or a stacked-layer structure including silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. Further, the thickness of the insulating layer can be, for example, greater than or equal to 1 nm and less than or equal to 100 nm, preferably greater than or equal to 10 nm and less than or equal to 50 nm.

The layer containing an electrically conductive material can be formed using a metal material such as aluminum, copper, titanium, tantalum, or tungsten. The layer containing an electrically conductive material may be formed using a semiconductor material such as polycrystalline silicon. There is no particular limitation on the formation method, and a variety of film formation methods such as an evaporation method, a CVD method, a sputtering method, or a spin coating method can be used. Note that in this embodiment, an example of the case where the layer containing an electrically conductive material is formed using a metal material is described.

Figure 11C:
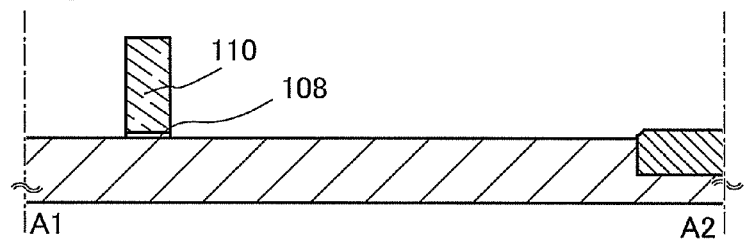

After that, the insulating layer and the layer containing an electrically conductive material are selectively etched to form the gate insulating layer 108 and the gate electrode 110 are formed (see FIG. 11C).

Next, phosphorus (P), arsenic (As), or the like is added to the substrate 185 to form the channel formation region 116 and the impurity region 120. Note that, although phosphorus or arsenic is added here in order to form an n-channel transistor, an impurity element such as boron (B) or aluminum (Al) should be added in the case where a p-channel transistor is be formed. Here, the concentration of the impurity to be added can be set as appropriate; the concentration is preferably increased when the semiconductor element is highly miniaturized.

Note that a sidewall insulating layer may be formed around the gate electrode 110, so that impurity regions to which the impurity element is added at different concentrations are formed.

Next, a metal layer 122 is formed so as to cover the gate electrode 110, the impurity regions 120, and the like. A variety of film formation methods such as a vacuum evaporation method, a sputtering method, or a spin coating method can be used to form the metal layer 122. The metal layer is desirably formed using a metal material that becomes a low-resistance metal compound by reacting with the semiconductor material forming the substrate 185. Examples of such a metal material are titanium, tantalum, tungsten, nickel, cobalt, platinum, and the like.

Next, heat treatment is performed to make the above metal layer react with the semiconductor material. Thus, the metal compound regions 124 in contact with the impurity regions 120 are formed. Note that when the gate electrode 110 is formed using polycrystalline silicon or the like, a metal compound region is also formed in a portion of the gate electrode 110 which is in contact with the metal layer.

As the above heat treatment, irradiation from a flash lamp can be used, for example. Although it is needless to say that another heat treatment method may be used, a method by which heat treatment for an extremely short time can be realized is desirably used in order to improve the controllability of chemical reaction in formation of the metal compound. Note that the above metal compound regions are formed by the reaction of the metal material and the semiconductor material and have sufficiently high conductivity. By the formation of the metal compound regions, the electric resistance can be sufficiently reduced and the element characteristics can be improved. Note that the metal layer is removed after the metal compound regions 124 are formed.

Figure 11D:
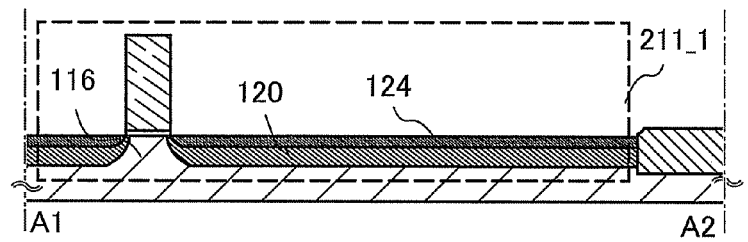

As described above, the transistor 211_1 using the substrate 185 including the semiconductor material is formed (see FIG. 11D). A feature of such a transistor 211_1 is that it can operate at high speed.

Note that before or after each of the above steps, a step for forming an additional electrode, wiring, semiconductor layer, or insulating layer may be included. For example, when the wiring has a multi-layer structure of a stacked-layer structure including insulating layers and electrically conductive layers, a highly integrated semiconductor device can also be realized.

Next, the insulating layer 128 and the insulating layer 130 are formed so as to cover the components formed through the above steps. The insulating layer 128 and the insulating layer 130 can be formed using a material containing an inorganic insulating material such as silicon oxide, silicon oxynitride, silicon nitride, or aluminum oxide. The insulating layer 128 and the insulating layer 130 are particularly preferably formed using a low dielectric constant (low-k) material, so that capacitance due to an overlap of electrodes or wirings can be sufficiently reduced. Note that a porous insulating layer formed using such a material may be used as the insulating layer 128 and the insulating layer 130. Since the porous insulating layer has a low dielectric constant as compared to a dense insulating layer, capacitance due to electrodes or wirings can be further reduced. Further, the insulating layer 128 and the insulating layer 130 can be formed using an organic insulating material such as a polyimide or an acrylic resin.

In this embodiment, a 50-nm-thick silicon oxynitride film is formed by a sputtering method for the insulating layer 128, and a 550-nm-thick silicon oxide film is formed by a sputtering method for the insulating layer 130.

Figure 11E:
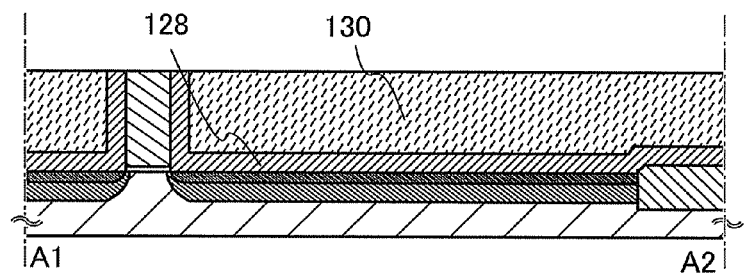

Next, as pretreatment for the formation of the switch transistor 202_1, CMP treatment is performed on the insulating layer 128 and the insulating layer 130, so that the insulating layer 128 and the insulating layer 130 are planarized and an upper surface of the gate electrode 110 is exposed (see FIG. 11E). As the treatment for exposing the upper surface of the gate electrode 110, etching treatment or the like can also be employed as an alternative to CMP treatment.

Note that an insulating layer functioning as a base may be provided over the insulating layer 130. The insulating layer can be formed by a PVD method, a CVD method, or the like.

Figure 12A:
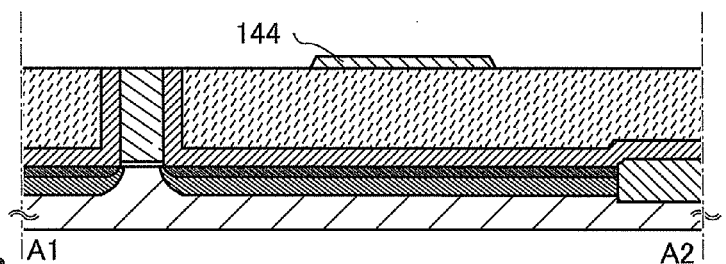
FIGS. 12A to 12D illustrate one mode of a method of fabricating a semiconductor device.
Figure 12B:
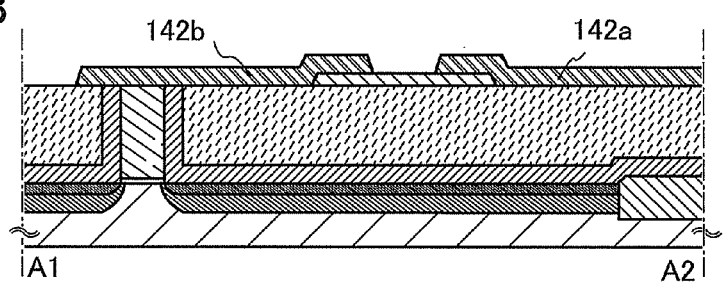

The oxide semiconductor layer 144 is formed over the insulating layer 130 which is sufficiently planarized by CMP treatment (see FIG. 12A).

The oxide semiconductor layer 144 can be formed using any of the following: oxides of four metal elements such as an In—Sn—Ga—Zn—O-based oxide; oxides of three metal elements such as an In—Ga—Zn—O-based oxide, an In—Sn—Zn—O-based oxide, an In—Al—Zn—O-based oxide, a Sn—Ga—Zn—O-based oxide, an Al—Ga—Zn—O-based oxide, and a Sn—Al—Zn—O-based oxide; oxides of two metal elements such as an In—Zn—O-based oxide, a Sn—Zn—O-based oxide, an Al—Zn—O-based oxide, a Zn—Mg—O-based oxide, a Sn—Mg—O-based oxide, and an In—Mg—O-based oxide; oxides of one metal element such as an In—O-based oxide, a Sn—O-based oxide, and a Zn—O-based oxide; and the like. Further, $SiO_2$ may be included in the above oxide semiconductor.

As a semiconductor material used for the semiconductor device, the In—Ga—Zn—O-based oxide semiconductor material is particularly suitable because, when there is no electric field, it has sufficiently high resistance and thus can realize a sufficiently small off-state current and because it has high field-effect mobility.

A typical example of the In—Ga—Zn—O-based oxide semiconductor material is the material represented by $InGaO_3(ZnO)_m$ (m>0). Another example is an oxide semiconductor material in which Ga is replaced by M and which is represented by $InMO_3(ZnO)_m$ (m>0). Here, M denotes one or more metal elements selected from gallium (Ga), aluminum (Al), iron (Fe), nickel (Ni), manganese (Mn), cobalt (Co), and the like. For example, as M, Ga, the combinations such as Ga and Al, Ga and Fe, Ga and Ni, Ga and Mn, or Ga and Co, or the like can be used. Note that the above compositions are deduced from the crystal structures and are just examples.

Further, in the case where an In—Zn—O-based material is used for the oxide semiconductor, a target with the following composition ratio is used: the composition ratio of In:Zn is 50:1 to 1:2 in an atomic ratio ($In_2O_3$:ZnO=25:1 to 1:4 in a molar ratio), preferably 20:1 to 1:1 in an atomic ratio ($In_2O_3$:ZnO=10:1 to 1:2 in a molar ratio), more preferably 15:1 to 1.5:1 in an atomic ratio ($In_2O_3$:ZnO=15:2 to 3:4 in a molar ratio). For example, a target used for the formation of an In—Zn—O-based oxide semiconductor has the following atomic ratio: the atomic ratio of In:Zn:O is X:Y:Z, where Z>1.5X+Y.

As a target used for forming the oxide semiconductor layer 144 by a sputtering method, an oxide having a composition ratio expressed by the equation In:Ga:Zn=1:x:y (x is 0 or more, and y is greater than or equal to 0.5 and less than or equal to 5) is preferred. For example, a target having a composition ratio expressed by the equation In:Ga:Zn=1:1:1 [atomic ratio] (x=1, y=1) (that is, $In_2O_3$:$Ga_2O_3$:ZnO=1:1:2 [molar ratio]), or the like can be used. A target having a composition ratio expressed by the equation In:Ga:Zn=1:1:0.5 [atomic ratio] (x=1, y=0.5), a target having a composition ratio expressed by the equation In:Ga:Zn=1:1:2 [atomic ratio] (x=1, y=2), or a target having a composition ratio expressed by the equation In:Ga:Zn=1:0:1 [atomic ratio] (x=0, y=1) can also be used.

In this embodiment, the oxide semiconductor layer 144 having an amorphous structure is formed using an In—Ga—Zn—O-based metal oxide target by a sputtering method. In addition, the thickness thereof is greater than or equal to 1 nm and less than or equal to 50 nm, preferably greater than or equal to 2 nm and less than or equal to 20 nm, further preferably greater than or equal to 3 nm and less than or equal to 15 nm.

The relative density of the metal oxide in the metal oxide target is 80% or more, preferably 95% or more, and further preferably 99.9% or more. The use of a metal oxide target having a high relative density makes it possible to form the oxide semiconductor layer with a dense structure.

The atmosphere in which the oxide semiconductor layer 144 is formed is preferably a rare gas (typically argon) atmosphere, an oxygen atmosphere, or a mixed atmosphere of a rare gas (typically argon) and oxygen. Specifically, it is preferable to use a high-purity gas atmosphere, for example, from which an impurity such as hydrogen, water, a hydroxyl group, or hydride is removed to a concentration of 1 ppm or less (preferably, a concentration of 10 ppb or less).

In the formation of the oxide semiconductor layer 144, for example, an object to be processed is held in a treatment chamber kept under reduced pressure and the object to be processed is heated to a temperature greater than or equal to 100° C. and lower than 550° C., preferably greater than or equal to 200° C. and lower than or equal to 400° C. Alternatively, the temperature of an object to be processed in the formation of the oxide semiconductor layer 144 may be room temperature (25° C.±10° C.). Then, a sputtering gas from which hydrogen, water, and the like are removed is introduced while moisture in the treatment chamber is removed, so that the oxide semiconductor layer 144 is formed using the above-described target. By forming the oxide semiconductor layer 144 during heating of the object to be processed, impurities in the oxide semiconductor layer 144 can be reduced. Moreover, damage due to sputtering can be reduced. In order to remove moisture in the process chamber, an entrapment vacuum pump is preferably used. For example, a cryopump, an ion pump, a titanium sublimation pump, or the like can be used. A turbo pump provided with a cold trap may be used. By performing evacuation with the use of a cryopump or the like, hydrogen, water, and the like can be removed from the process chamber; thus, the impurity concentration in the oxide semiconductor layer can be reduced.

The oxide semiconductor layer 144 can be formed under the following conditions, for example: a distance between the object to be processed and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere containing oxygen and argon. Note that a pulse direct-current (DC) power supply is preferably used so that dust (e.g., powdery substances produced at the time of deposition) can be reduced and the film thickness can be uniform. The thickness of the oxide semiconductor layer 144 is greater than or equal to 1 nm and less than or equal to 50 nm, preferably greater than or equal to 2 nm and less than or equal to 20 nm, more preferably greater than or equal to 3 nm and less than or equal to 15 nm. By use of a structure according to the disclosed invention, a short-channel effect due to miniaturization can be suppressed even in the case where the oxide semiconductor layer 144 having such a thickness is used. Note that an appropriate thickness differs depending on an oxide semiconductor material that is used, the usage of a semiconductor device, or the like; therefore, it is also possible to set the thickness as appropriate depending on the material that is used, the usage, or the like. Note that by the above-described formation of the insulating layer 140, a formation surface of a portion corresponding to the channel formation region in the oxide semiconductor layer 144 can be sufficiently planarized; thus, the oxide semiconductor layer can be suitably formed even when it is an oxide semiconductor layer having a small thickness. In addition, as illustrated in FIG. 12A, a cross-sectional shape of the portion corresponding to the channel formation region of the oxide semiconductor layer 144 is preferably a planar shape. When the cross-sectional shape of the portion corresponding to the channel formation region of the oxide semiconductor layer 144 is a planar shape, leakage current can be reduced as compared to the case where the cross-sectional shape of the oxide semiconductor layer 144 is not a planar shape.

Note that before the oxide semiconductor layer 144 is formed by a sputtering method, a substance adhering to the formation surface (e.g., the surface of the insulating layer 140) may be removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method of making ions collide with a surface to be processed is a method in which a high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

After the oxide semiconductor layer 144 is formed, heat treatment (first heat treatment) is preferably performed on the oxide semiconductor layer 144. Through this first heat treatment, excessive hydrogen (including water or a hydroxyl group) in the oxide semiconductor layer 144 can be removed, the structure of the oxide semiconductor layer 144 can be ordered, and defect levels in the energy gap can be reduced. The temperature of the first heat treatment is, for example, greater than or equal to 300° C. and less than 550° C., preferably greater than or equal to 400° C. and less than or equal to 500° C.

The heat treatment can be performed in such a way that, for example, an object to be processed is introduced into an electric furnace in which a resistance heating element or the like is used and heated, in a nitrogen atmosphere at 450° C. for 1 hour. During this, the oxide semiconductor layer is not exposed to air to prevent the entry of water and hydrogen.

The heat treatment apparatus is not limited to the electric furnace and may be an apparatus for heating an object to be processed by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus with which an object to be processed is heated by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus with which heat treatment is performed using a high-temperature gas. As the gas, an inert gas which does not react with an object to be processed by heat treatment, such as nitrogen or a rare gas such as argon is used.

For example, as the first heat treatment, a GRTA process may be performed as follows: an object to be processed is put in a heated inert gas atmosphere, heated for several minutes, and taken out from the inert gas atmosphere. The GRTA process enables high-temperature heat treatment for a short time. Moreover, the GRTA process can be employed even when the temperature exceeds the upper temperature limit of the object to be processed. Note that the inert gas may be switched to a gas containing oxygen during the process. This is because defect levels in the energy gap due to oxygen vacancies can be reduced through the first heat treatment in an atmosphere containing oxygen.

Note that as the inert gas atmosphere, an atmosphere that contains nitrogen or a rare gas (e.g., helium, neon, or argon) as the main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

In any case, impurities are reduced by the first heat treatment, so that an i-type semiconductor (an intrinsic semiconductor) or a substantially i-type semiconductor is formed; thus, a transistor having extremely excellent characteristics can be realized.

The above heat treatment (first heat treatment) can also be referred to as dehydration treatment, dehydrogenation treatment, or the like because it has the effect of removing hydrogen, water, or the like. The dehydration treatment or the dehydrogenation treatment can also be performed with timing after the formation of the oxide semiconductor layer 144, after the formation of the gate insulating layer 146, after the formation of the gate electrode, or the like. Further, such dehydration treatment or dehydrogenation treatment may be performed once or more times.

The etching of the oxide semiconductor layer 144 may be performed before the above heat treatment or after the above heat treatment. Further, although dry etching is preferably used in terms of miniaturization of an element, wet etching may be used. An etching gas and an etchant can be selected as appropriate depending on a material to be etched. Note that in the case where leakage in an element or the like does not cause a problem, the oxide semiconductor layer may be used without being processed into an island shape.

Next, an electrically conductive layer is formed over the gate electrode 110, the insulating layer 128, the insulating layer 130, and the like. The electrically conductive layer is selectively etched to form the source electrode 142a and the drain electrode 142b in contact with the gate electrode 110 (see FIG. 12B).

The electrically conductive layer can be formed by a PVD method such as a sputtering method, or a CVD method such as a plasma CVD method. Further, as a material of the electrically conductive layer, an element selected from Al, Cr, Cu, Ta, Ti, Mo, and W, an alloy containing the above element as a component, or the like can be used. Any of Mn, Mg, Zr, Be, Nd, and Sc, or a material in which these are combined may be used.

Further, the electrically conductive layer may be formed using electrically conductive metal oxide. As the electrically conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO in some cases), indium oxide-zinc oxide ($In_2O_3$—ZnO), or any of these metal oxide materials in which silicon or silicon oxide is contained can be used. Further, graphene may be used for the electrically conductive layer.

The electrically conductive layer may have a single-layer structure or a stacked-layer structure of two or more layers. Examples thereof are a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, and the like. Note that in the case where the electrically conductive layer has a single-layer structure of a titanium film or a titanium nitride film, there is an advantage that the electrically conductive layer is easily processed into the source electrode 142a and the drain electrode 142b having tapered shapes.

The channel length (L) of the switch transistor 202_1 in the upper portion is determined by the distance between a lower end portion of the source electrode 142a and a lower end portion of the drain electrode 142b. Note that in light exposure for forming a mask used for a transistor with a channel length (L) less than 25 nm, it is preferable to use extreme ultraviolet rays whose wavelength is as short as several nanometers to several tens of nanometers.

Next, the gate insulating layer 146 is formed so as to cover the source electrode 142a, the drain electrode 142b, and the oxide semiconductor layer 144.

The gate insulating layer 146 can be formed by a CVD method, a sputtering method, or the like. Further, the gate insulating layer 146 is preferably formed so as to include silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a stacked-layer structure. There is no particular limitation on the thickness; when miniaturized, the semiconductor device is desirably thin in order to ensure the operation of the transistor. For example, in the case where silicon oxide is used, the thickness can be greater than or equal to 1 nm and less than or equal to 100 nm, preferably greater than or equal to 10 nm and less than or equal to 50 nm.

When the gate insulating layer is made thin as described above, a problem of gate leakage due to a tunnel effect or the like is caused. In order to solve the problem of gate leakage, a high dielectric constant (high-k) material such as hafnium oxide, tantalum oxide, yttrium oxide, hafnium silicate (Hf-$Si_xO_y$ (x>0, y>0)), hafnium silicate (Hf$Si_xO_y$ (x>0, y>0)) to which nitrogen is added, or hafnium aluminate (Hf$Al_xO_y$ (x>0, y>0)) to which nitrogen is added should be used for the gate insulating layer 146. By use of a high-k material for the gate insulating layer 146, electrical characteristics can be ensured and the thickness can be large to suppress gate leakage. For example, the relative dielectric constant of hafnium oxide is approximately 15 and significantly higher than the relative dielectric constant of silicon oxide which is 3 to 4. With use of such a material, a gate insulating layer having an equivalent oxide thickness less than 15 nm, preferably greater than or equal to 2 nm and less than or equal to 10 nm, can be easily realized. Note that a stacked-layer structure of a film containing a high-k material and a film containing any of silicon oxide, silicon nitride, silicon oxynitride, silicon nitride oxide, aluminum oxide, and the like may also be used.

Further, a metal oxide film is preferably used as a film in contact with the oxide semiconductor layer 144, like the gate insulating layer 146. The metal oxide film is formed using a material such as silicon oxide, silicon nitride, silicon oxynitride, or silicon nitride oxide, for example. Alternatively, a material containing a Group 13 element and oxygen can be used. Examples of the material containing a Group 13 element and oxygen are a material containing one or more of gallium oxide, aluminum oxide, aluminum gallium oxide, and gallium aluminum oxide, and the like. Here, aluminum gallium oxide refers to a material in which the aluminum content is higher than the gallium content in atomic percent, and gallium aluminum oxide refers to a material in which the gallium content is higher than or equal to the aluminum content in atomic percent. The metal oxide film can be formed with a single-layer structure or a stacked-layer structure using the above-described materials.

After the gate insulating layer 146 is formed, second heat treatment is desirably performed in an inert gas atmosphere or an oxygen atmosphere. The temperature of the heat treatment is greater than or equal to 200° C. and less than or equal to 450° C., preferably greater than or equal to 250° C. and less than or equal to 350° C. For example, the heat treatment should be performed at 250° C. for 1 hour in a nitrogen atmosphere. By the second heat treatment, variation in electric characteristics of transistors can be reduced. Further, in the case where the gate insulating layer 146 contains oxygen, oxygen can be supplied to the oxide semiconductor layer 144 to fill oxygen vacancies in the oxide semiconductor layer 144 so that an oxide semiconductor layer of an i-type semiconductor (an intrinsic semiconductor) or a substantially i-type semiconductor can be formed.

Note that in this embodiment, the second heat treatment is performed after the gate insulating layer 146 is formed; the timing of the second heat treatment is not limited thereto. For example, the second heat treatment may be performed after the formation of the gate electrode. Alternatively, the first heat treatment and the second heat treatment may be successively performed, the first heat treatment may double as the second heat treatment, or the second heat treatment may double as the first heat treatment.

As described above, at least one of the first heat treatment and the second heat treatment is applied, so that the oxide semiconductor layer 144 can be highly purified so as to minimize the amount of impurities that are not the main components.

Next, the gate electrode 148 is formed over the gate insulating layer 146.

The gate electrode 148 can be formed in such a way that an electrically conductive layer is formed over the gate insulating layer 146 and then selectively etched. The electrically conductive layer serving as the gate electrode 148 can be formed by a PVD method such as a sputtering method or a CVD method such as a plasma CVD method. The details are similar to those of the source electrode 142a, the drain electrode 142b, or the like; thus, the description thereof can be referred to.

Figure 12C:
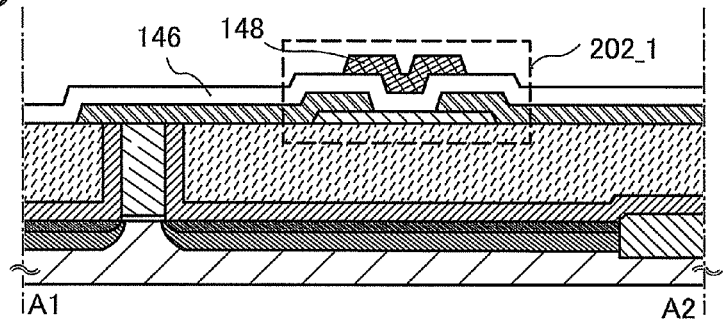

As described above, the switch transistor 202_1 including the oxide semiconductor layer 144 which is highly purified is completed (see FIG. 12C). A feature of the switch transistor 202_1 is sufficiently reduced off-state current. Therefore, with the use of the transistor as a switch transistor, a potential can be held for a long time.

Next, the insulating layer 150 is formed over the gate insulating layer 146 and the gate electrode 148. The insulating layer 150 can be formed by a PVD method, a CVD method, or the like, and can be formed with a single layer or a stacked layer using a material containing an inorganic insulating material such as silicon oxide, silicon oxynitride, silicon nitride, hafnium oxide, or aluminum oxide.

Note that for the insulating layer 150, a material with a low dielectric constant or a structure with a low dielectric constant (e.g., a porous structure) is preferably used. This is because, by a reduction in the dielectric constant of the insulating layer 150, capacitance between wirings, electrodes, or the like can be reduced so that an increase in operation speed is possible.

Figure 12D:
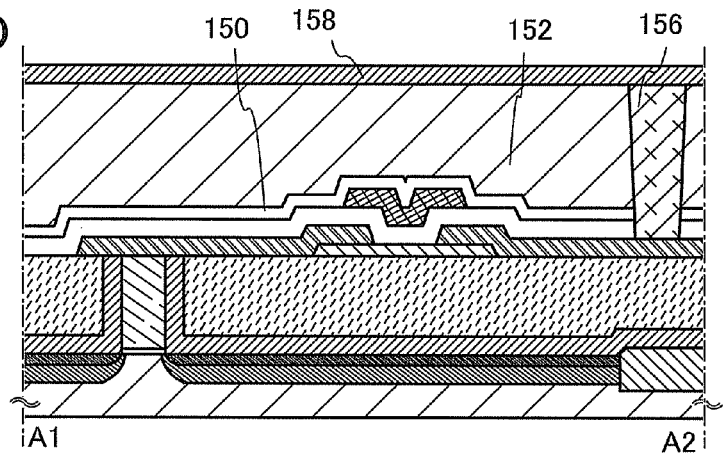

Next, after the opening reaching the source electrode 142a is formed in the gate insulating layer 146, the insulating layer 150, and the insulating layer 152, the electrode 156 is formed in the opening, and the wiring 158 in contact with the electrode 156 is formed over the insulating layer 152 (see FIG. 12D). The opening is formed by selective etching with the use of a mask or the like.

Like the insulating layer 150, the insulating layer 152 can be formed by a PVD method, a CVD method, or the like, and can be formed with a single layer or a stacked layer using a material containing an inorganic insulating material such as silicon oxide, silicon oxynitride, silicon nitride, hafnium oxide, or aluminum oxide.

Note that for the insulating layer 152, a material with a low dielectric constant or a structure with a low dielectric constant (e.g., a porous structure) is desirably used. This is because, by a reduction in the dielectric constant of the insulating layer 152, capacitance between wirings, electrodes, or the like can be reduced so that an increase in operation speed is possible.

Note that the insulating layer 152 is desirably formed so that a surface thereof is planarized. This is because, when the insulating layer 152 is preferably formed so that a surface thereof is planarized, an electrode, a wiring, or the like can be favorably formed over the insulating layer 152 even in the case where the semiconductor device is miniaturized, for example. The planarization for the insulating layer 152 can be performed by a method such as CMP (chemical mechanical polishing).

The electrode 156 can be formed in such a way that, for example, an electrically conductive layer is formed by a PVD method, a CVD method, or the like in a region including an opening and then part of the electrically conductive layer is removed by etching treatment, CMP, or the like.

Specifically, it is possible to employ a method, for example, in which a thin titanium film is formed in a region including an opening by a PVD method and a thin titanium nitride film is formed by a CVD method, and then, a tungsten film is formed so as to fill the opening. Here, the titanium film formed by a PVD method has a function of reducing an oxide film (such as a natural oxide film) over which the titanium film is to be formed, and thereby lowering contact resistance with lower electrodes or the like (the drain electrode 142b, here). The subsequently formed titanium nitride film has a barrier function of suppressing diffusion of an electrically conductive material. After the formation of the barrier film of titanium, titanium nitride, or the like, a copper film may be formed by a plating method.

The wiring 158 is formed in such a way that an electrically conductive layer is formed by a PVD method such as a sputtering method or a CVD method such as a plasma CVD method and then the electrically conductive layer is etched into a desired shape. As a material for the electrically conductive layer, an element selected from aluminum, chromium, copper, tantalum, titanium, molybdenum, and tungsten, an alloy containing these elements as a component, or the like can be used. Further, any of manganese, magnesium, zirconium, beryllium, neodymium, and scandium or a material in which these are combined may be used. The details are similar to those of the source electrode 142a or the like.

Note that a variety of wirings, electrodes, or the like may be formed after the above steps. The wirings or the electrodes can be formed by a method such as a so-called damascene method or dual damascene method.

Through the above steps, the semiconductor device having the structure illustrated in FIGS. 10A and 10B can be fabricated.

Figure 14A:
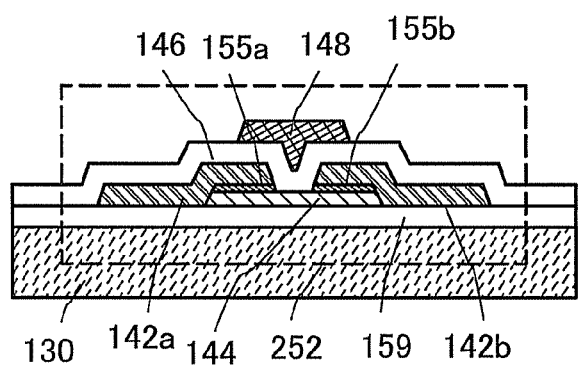
FIGS. 14A and 14B each illustrate one mode of a semiconductor device.
Figure 14B:
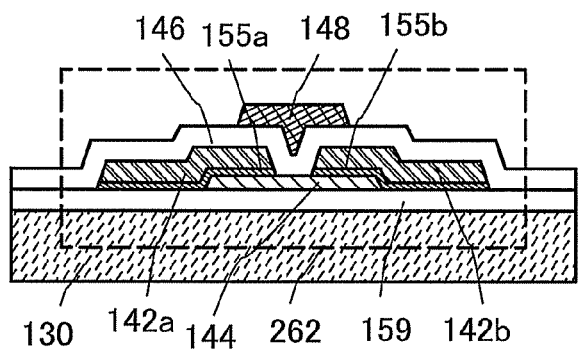

Further, an electrically conductive oxide layer functioning as the source and drain regions may be provided as buffer layers between the oxide semiconductor layer 144 and the source electrode 142a and between the oxide semiconductor layer 144 and the drain electrode 142b. FIGS. 14A and 14B illustrate, respectively, a transistor 252 and a transistor 262, in each of which the electrically conductive oxide layer is provided in the transistor illustrated as the switch transistor 202_1 in FIGS. 10A and 10B.

In the transistors 252 and 262 in FIGS. 14A and 14B, electrically conductive oxide layers 155a and 155b functioning as the source and drain regions are formed between the oxide semiconductor layer 144 and the source electrode 142a and between the oxide semiconductor layer 144 and the drain electrode 142b. The transistors 252 and 262 in FIGS. 14A and 14B are examples that differ in the shape of the electrically conductive oxide layers 155a and 155b depending on fabricating steps.

Further, FIG. 14A is an example where an insulating layer 159 is provided between the insulating layer 130 and the transistor 252, and FIG. 14B is an example where the insulating layer 159 is provided between the insulating layer 130 and the transistor 262. For the insulating layer 159, an oxide insulating layer having a thickness greater than or equal to 50 nm and less than or equal to 600 nm is formed by a PCVD method or a sputtering method. For example, one layer selected from a silicon oxide film, a gallium oxide film, an aluminum oxide film, a silicon oxynitride film, an aluminum oxynitride film, and a silicon nitride oxide film or a stacked layer of any of these films can be used.

In the transistor 252 in FIG. 14A, a stacked layer of the oxide semiconductor film and an electrically conductive oxide film is formed, and the shape of the stacked layer of the oxide semiconductor film and the electrically conductive oxide film is processed by the same photolithography step to form the island-shaped oxide semiconductor layer 144 and the island-shaped electrically conductive oxide film. After the source electrode 142a and the drain electrode 142b are foamed over the oxide semiconductor layer and the electrically conductive oxide film, the island-shaped electrically conductive oxide film is etched with the source electrode 142a and the drain electrode 142b as a mask, so that the electrically conductive oxide layers 155a and 155b serving as the source and drain regions are formed.

In the transistor 262 in FIG. 14B, an electrically conductive oxide film is formed over the oxide semiconductor layer 144, an electrically conductive metal film is formed thereover, and the electrically conductive oxide film and the electrically conductive metal film are processed by the same photolithography step, so that the electrically conductive oxide layers 155a and 155b serving as the source and drain regions, the source electrode 142a, and the drain electrode 142b are formed.

Note that in the etching treatment for processing the shape of the electrically conductive oxide layer, etching conditions (e.g., the kind of etchant, the concentration, or the etching time) are adjusted as appreciate so that oxide semiconductor layer is not excessively etched.

As a formation method of the electrically conductive oxide layers 155a and 155b, a sputtering method, a vacuum evaporation method (e.g., an electron beam evaporation method), an arc discharge ion plating method, or a spray method can be used. As a material of the electrically conductive oxide layer, zinc oxide, zinc aluminum oxide, zinc aluminum oxynitride, zinc gallium oxide, indium oxide, tin oxide, indium oxide-tin oxide, indium oxide-zinc oxide, or the like can be used. In addition, silicon oxide may be contained in any of the above materials.

The electrically conductive oxide layers are provided as the source region between the oxide semiconductor layer 144 and the source electrode 142a and as the drain region between the oxide semiconductor layer 144 and the drain electrode 142b, so that a reduction in the resistance of the source and drain regions is possible and the transistors 252 and 262 can operate at high speed.

Further, with the structure in which the oxide semiconductor layer 144, the electrically conductive oxide layer 155b, and the drain electrode 142b are provided, the withstand voltage of the transistors 252 and 262 can be improved.

In the switch transistor 202_1 described in this embodiment, the oxide semiconductor layer 144 is highly purified and thus the hydrogen concentration thereof is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$. In addition, the carrier density of the oxide semiconductor layer 144 has a sufficiently low value (e.g., less than $1 \times 10^{12}$/cm$^3$, preferably less than $1.45 \times 10^{10}$/cm$^3$) in comparison with that of a general silicon wafer (approximately $1 \times 10^{14}$/cm$^3$). In addition, the off-state current of the switch transistor 202_1 is also sufficiently small. For example, the off-state current (per unit channel width (1 mm) here) of the switch transistor 202_1 at room temperature (25° C.) is 100 zA (1 zA (zeptoampere) is $1 \times 10^{-21}$ A) or less, preferably 10 zA or less.

By use of the oxide semiconductor layer 144 which is thus purified and intrinsic, it becomes easy to sufficiently reduce the off-state current of the switch transistor 202_1. Further, by use of the switch transistor 202_1, a semiconductor device capable of holding a potential for a long time can be obtained.

The structure and method described above in this embodiment or the like can be combined as appropriate with any of the methods and structures described in the other embodiments.

Embodiment 5

In this embodiment, an example of a transistor that can be applied to a semiconductor device disclosed in this specification will be described. There is no particular limitation on the structure of the transistor that can be applied to a semiconductor device disclosed in this specification; for example, a staggered type or a planar type having a top-gate structure or a bottom-gate structure can be used. The transistor may have a single-gate structure in which one channel formation region is formed, a double-gate structure in which two channel formation regions are formed, or a triple-gate structure in which three channel formation regions are formed. Alternatively, the transistor may have a dual gate structure having two gate electrode layers positioned over and below a channel region with a gate insulating layer interposed therebetween.

FIGS. 13A to 13D illustrate examples of cross-sectional structures of a transistor which can be applied to a semiconductor device disclosed in this specification (e.g., the switch transistors 202_1 to 202_$n$, the transistors 232_1 to 232_$n$, or the transistor 204 in Embodiments 1 to 4). In each of FIGS. 13A to 13D, the transistor is provided over an insulating layer 400; however, the transistor may be provided over a substrate such as a glass substrate. Note that in the case where any of the transistors illustrated in FIGS. 13A to 13D is applied to the switch transistor 202_1 in Embodiment 4, the insulating layer 400 corresponds to the insulating layer 130.

Figure 13A:
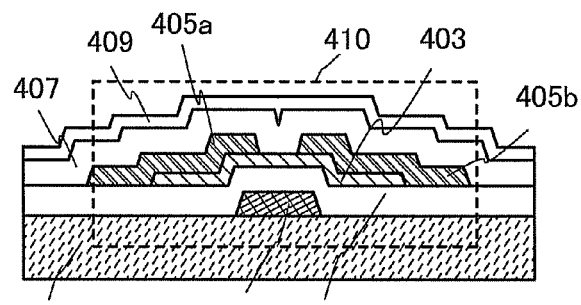
FIGS. 13A to 13D each illustrate one mode of a semiconductor device.

A transistor 410 illustrated in FIG. 13A is one of thin film transistors having a bottom-gate structure and also referred to as an inverted-staggered type thin film transistor.

The transistor 410 includes, over the insulating layer 400, a gate electrode layer 401, a gate insulating layer 402, an oxide semiconductor layer 403, a source electrode layer 405a, and a drain electrode layer 405b. Further, an insulating layer 407 stacked over the oxide semiconductor layer 403 is provided so as to cover the transistor 410. The insulating layer 409 is formed over the insulating layer 407.

Figure 13B:
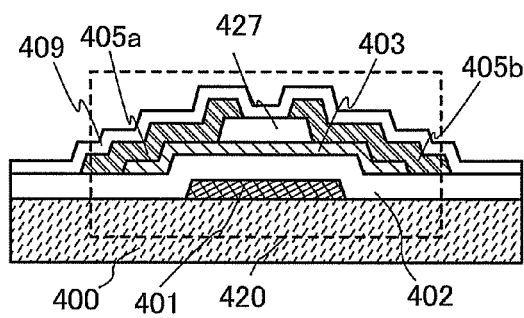

A transistor 420 illustrated in FIG. 13B is one of thin film transistors having a bottom-gate structure referred to as a channel-protective type (also referred to as a channel-stop type) transistor and also referred to as an inverted-staggered type thin film transistor.

The transistor 420 includes, over the insulating layer 400, the gate electrode layer 401, the gate insulating layer 402, the oxide semiconductor layer 403, an insulating layer 427 functioning as a channel protective layer which covers a channel formation region of the oxide semiconductor layer 403, the source electrode layer 405a, and the drain electrode layer 405b. Further, the insulating layer 409 is formed to cover the transistor 420.

Figure 13C:
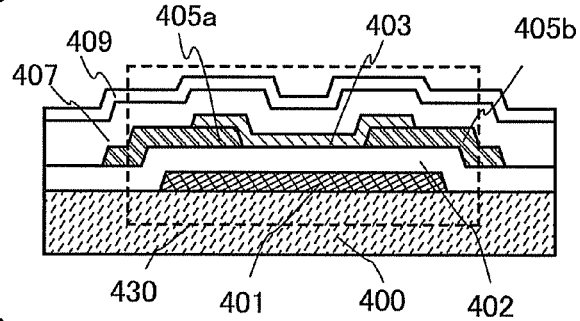

A transistor 430 illustrated in FIG. 13C is a bottom-gate type thin film transistor and includes, over an insulating layer 400 which is a substrate having an insulating surface, a gate electrode layer 401, a gate insulating layer 402, a source electrode layer 405a, a drain electrode layer 405b, and the oxide semiconductor layer 403. Further, the insulating layer 407 which covers the transistor 430 and is in contact with the oxide semiconductor layer 403 is provided. The insulating layer 409 is further formed over the insulating layer 407.

In the transistor 430, the gate insulating layer 402 is provided on and in contact with the insulating layer 400 and the gate electrode layer 401, and the source electrode layer 405a and the drain electrode layer 405b are provided on and in contact with the gate insulating layer 402. Further, the oxide semiconductor layer 403 is provided over the gate insulating layer 402, the source electrode layer 405a, and the drain electrode layer 405b.

Figure 13D:
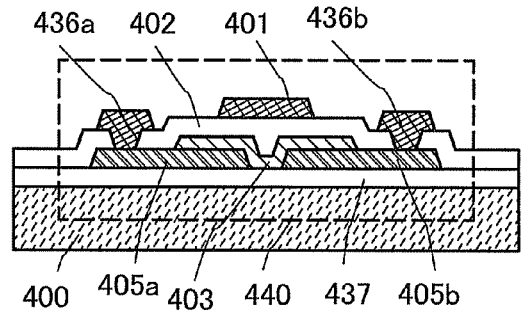

A transistor 440 illustrated in FIG. 13D is one of thin film transistors having a top-gate structure. The transistor 440 includes, over the insulating layer 400, an insulating layer 437, the source electrode layer 405a, the drain electrode layer 405b, the oxide semiconductor layer 403, the gate insulating layer 402, and the gate electrode layer 401. A wiring layer 436a and a wiring layer 436b are provided in contact with and electrically connected to the source electrode layer 405a and the drain electrode layer 405b respectively.

In the case where the transistors 410, 420, and 430 each having a bottom-gate structure are provided over the substrate, an insulating film serving as a base film may be provided between the substrate and the gate electrode layer. The base film has a function of preventing diffusion of an impurity element from the substrate, and can be formed with a single-layer structure or a stacked-layer structure of one or more of a silicon nitride film, a silicon oxide film, a silicon nitride oxide film, and a silicon oxynitride film.

The gate electrode layer 401 can be formed with a single layer or a stacked layer using a metal material such as molybdenum, titanium, chromium, tantalum, tungsten, aluminum, copper, neodymium, or scandium, or an alloy material that contains these materials as the main component.

The gate insulating layer 402 can be formed with a single layer or a stacked layer of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by a plasma CVD method, a sputtering method, or the like. For example, by a plasma CVD method, a silicon nitride layer ($SiN_y$ ($y>0$)) with a thickness greater than or equal to 50 nm and less than or equal to 200 nm is formed as a first gate insulating layer, and a silicon oxide layer ($SiO_x$ ($x>0$)) with a thickness greater than or equal to 5 nm and less than or equal to 300 nm is stacked as a second gate insulating layer over the first gate insulating layer, so that a gate insulating layer with a total thickness of 200 nm is formed.

As an electrically conductive film used for the source electrode layer 405a and the drain electrode layer 405b, for example, a film of an element selected from Al, Cr, Cu, Ta, Ti, Mo, and W, an alloy containing the above elements as a component, an alloy containing these elements in combination, or the like can be used. Further, a structure in which a high-melting-point metal layer of Ti, Mo, W, or the like is stacked on one of or both a lower side and an upper side of a metal layer of Al, Cu, or the like may be formed. Further, by use of an Al material to which an element (e.g., Si, Nd, or Sc) which prevents generation of a hillock and a whisker in an Al film is added is used, heat resistance can be increased.

The same material as that of the source electrode layer 405a and the drain electrode layer 405b can be used for an electrically conductive film such as the wiring layer 436a and the wiring layer 436b which are connected to the source electrode layer 405a and the drain electrode layer 405b.

Alternatively, the electrically conductive film serving as the source electrode layer 405a and the drain electrode layer 405b (including a wiring layer formed with the same layer as these) may be formed with an electrically conductive metal oxide. As the electrically conductive metal oxide, indium oxide ($In_2O_3$), tin oxide ($SnO_2$), zinc oxide ($ZnO$), indium oxide-tin oxide ($In_2O_3$—$SnO_2$; abbreviated to ITO), indium oxide-zinc oxide ($In_2O_3$—ZnO), or any of these metal oxide materials in which silicon or silicon oxide is contained can be used.

As the insulating layers 407, 427, and 437, an inorganic insulating film such as a silicon oxide film, a silicon oxynitride film, an aluminum oxide film, or an aluminum oxynitride film can be typically used.

For the insulating layer 409, an inorganic film such as a silicon nitride film, an aluminum nitride film, a silicon nitride oxide film, or an aluminum nitride oxide film can be used.

In addition, a planarization insulating film may be formed over the insulating layer 409 in order to reduce surface unevenness due to the transistor. As the planarization insulating film, an organic material such as polyimide, an acrylic resin, and a benzocyclobutene-based resin can be used. Other than the above organic materials, a low-dielectric constant material (low-k material) or the like can be used. Note that the planarization insulating film may be formed by a stack of a plurality of insulating films formed with these materials.

This embodiment can be implemented in appropriate combination with the structures described in the other embodiments.

Embodiment 6

Figure 15A:
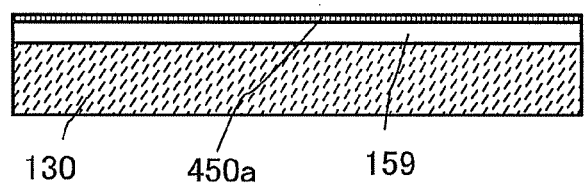
FIGS. 15A to 15C illustrates one mode of a method of fabricating a semiconductor device.
Figure 15B:
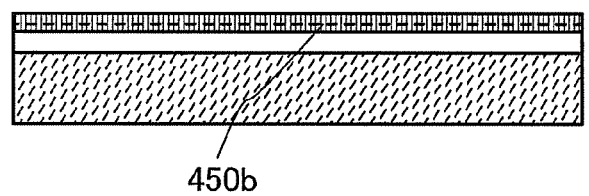

One mode of the oxide semiconductor layer which can be used as the semiconductor layer of the transistor in the above Embodiments 1 to 5 (e.g., the switch transistors 202_1 to 202_n, the transistors 232_1 to 232_n, or the transistor 204 in Embodiments 1 to 4) will be described using FIGS. 15A to 15C.

An oxide semiconductor layer of this embodiment has a stacked-layer structure including a first crystalline oxide semiconductor film and a second crystalline oxide semiconductor film thereover which is thicker than the first crystalline oxide semiconductor film.

The insulating layer 159 is formed over the insulating layer 130. In this embodiment, for the insulating layer 159, an oxide insulating layer having a thickness greater than or equal to 50 nm and less than or equal to 600 nm is formed by a PCVD method or a sputtering method. For example, one layer selected from a silicon oxide film, a gallium oxide film, an aluminum oxide film, a silicon oxynitride film, an aluminum oxynitride film, and a silicon nitride oxide film or a stacked layer of any of these films can be used.

Next, a first oxide semiconductor film having a thickness greater than or equal to 1 nm and less than or equal to 10 nm is formed over the insulating layer 159. A sputtering method is used for the formation of the first oxide semiconductor film, and the substrate temperature during the film formation is greater than or equal to 200° C. and less than or equal to 400° C.

In this embodiment, the first oxide semiconductor film is formed to a thickness of 5 nm using a target for an oxide semiconductor (target for an In—Ga—Zn—O-based oxide semiconductor containing $In_2O_3$, $Ga_2O_3$, and ZnO at 1:1:2 [molar ratio]), with a distance between the substrate and the target of 170 mm, a substrate temperature of 250° C., a pressure of 0.4 Pa, and a direct current (DC) power source of 0.5 kW in an atmosphere of only oxygen, only argon, or argon and oxygen.

Next, the atmosphere of a chamber in which the substrate is set is an atmosphere of nitrogen or dry air so that first heat treatment is performed. The temperature of the first heat treatment is greater than or equal to 400° C. and less than or equal to 750° C. Through the first heat treatment, a first crystalline oxide semiconductor layer 450a is formed (see FIG. 15A).

Depending on the temperature of the first heat treatment, the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 159 that is an oxide insulating layer is diffused to an interface with the first crystalline oxide semiconductor layer 450a or the vicinity of the interface (within ±5 nm from the interface), so that oxygen vacancies in the first crystalline oxide semiconductor film are reduced. Therefore, it is preferable that oxygen be included in (in a bulk of) the insulating layer 159 used as a base insulating layer or at the interface between the first crystalline oxide semiconductor layer 450a and the insulating layer 159 at an amount that at least exceeds the amount of oxygen in the stoichiometric ratio of the insulating layer 159.

Next, a second oxide semiconductor film thicker than 10 nm is formed over the first crystalline oxide semiconductor layer 450a. The second oxide semiconductor film is formed by a sputtering method, and the substrate temperature in the film formation is set to greater than or equal to 200° C. and less than or equal to 400° C. By setting the substrate temperature in the film formation to greater than or equal to 200° C. and less than or equal to 400° C., precursors can be arranged in the oxide semiconductor film formed over and in contact with the surface of the first crystalline oxide semiconductor film and so-called orderliness can be obtained.

In this embodiment, the second oxide semiconductor film is formed to a thickness of 25 nm in an oxygen atmosphere, an argon atmosphere, or an atmosphere containing argon and oxygen under conditions where a target for an oxide semiconductor (target for an In—Ga—Zn—O-based oxide semiconductor including $In_2O_3$, $Ga_2O_3$, and ZnO at 1:1:2 [molar ratio]) is used, a distance between the substrate and the target is 170 mm, the substrate temperature is 400° C., the pressure is 0.4 Pa, and the direct current (DC) power is 0.5 kW.

Next, the atmosphere of a chamber in which the substrate is set is nitrogen, oxygen, or dry air so that second heat treatment is performed. The temperature of the second heat treatment is greater than or equal to 400° C. and less than or equal to 750° C. Through the second heat treatment, a second crystalline oxide semiconductor layer 450b is formed (see FIG. 15B). The second heat treatment is performed in a nitrogen atmosphere, an oxygen atmosphere, or a mixed atmosphere of nitrogen and oxygen, so that the density of the second crystalline oxide semiconductor layer is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside of the second crystalline oxide semiconductor layer 450b; thus, the second crystalline oxide semiconductor layer 450b is formed.

It is preferable that steps from the formation of the insulating layer 159 to the second heat treatment be successively performed without exposure to the air. The steps from the formation of the insulating layer 159 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or less, preferably a dew point of −50° C. or less may be employed.

Figure 15C:
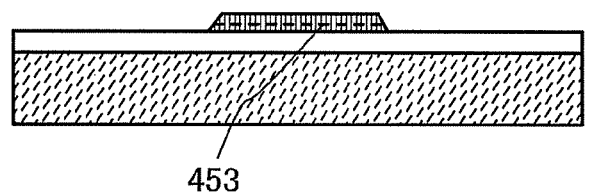

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 15C). In the drawing, the first crystalline oxide semiconductor layer 450a and the second crystalline oxide semiconductor layer 450b, the interface between which is indicated by a dotted line, are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an inkjet method.

For the etching of the stack of the oxide semiconductor layers, either dry etching or wet etching may be employed. Needless to say, these may be employed in combination.

A feature of the first crystalline oxide semiconductor layer and the second crystalline oxide semiconductor layer obtained by the above fabrication method is that they have c-axis alignment. Note that the first crystalline oxide semiconductor layer and the second crystalline oxide semiconductor layer comprise an oxide including a crystal with c-axis alignment (also referred to as a c-axis aligned crystal (CAAC)), which has neither a single crystal structure nor an amorphous structure. Note that the first crystalline oxide semiconductor layer and the second crystalline oxide semiconductor layer partly include a crystal grain boundary.

Note that the first and second crystalline oxide semiconductor layers are each formed with an oxide material containing at least Zn. Examples thereof are oxides of four metal elements, such as an In—Al—Ga—Zn—O-based material and an In—Sn—Ga—Zn—O-based material, oxides of three metal elements, such as an In—Ga—Zn—O-based material, an In—Al—Zn—O-based material, an In—Sn—Zn—O-based material, a Sn—Ga—Zn—O-based material, an Al—Ga—Zn—O-based material, and a Sn—Al—Zn—O-based material, oxides of two metal elements, such as an In—Zn—O-based material, a Sn—Zn—O-based material, an Al—Zn—O-based material, and an Zn—Mg—O based-material, a Zn—O based-material, and the like. Alternatively, an In—Si—Ga—Zn—O-based material, an In—Ga—B—Zn—O-based material, or an In—B—Zn—O-based material may be used. Further, $SiO_2$ may be contained in the above material. Here, for example, an In—Ga—Zn—O-based material means an oxide film having indium (In), gallium (Ga), and zinc (Zn), and there is no particular limitation on the composition ratio. Further, the In—Ga—Zn—O-based material may contain an element other than In, Ga, and Zn.

Without limitation to the two-layer structure in which the second crystalline oxide semiconductor layer is formed over the first crystalline oxide semiconductor layer, a stacked-layer structure of three or more layers may be formed by repeatedly performing a process of film formation and heat treatment for forming a third crystalline oxide semiconductor layer after the second crystalline oxide semiconductor layer is formed.

The oxide semiconductor layer 453 including the stack of the oxide semiconductor layers formed by the above fabrication method can be used as appropriate for a transistor which can be applied to a semiconductor device disclosed in this specification (for example, (e.g., the switch transistors 202_1 to 202_n, the transistors 232_1 to 232_n, or the transistors 204, 252, and 262 in Embodiments 1 to 4), or the transistors 410, 420, 430, and 440 in Embodiment 5).

In the switch transistor 202_1 in Embodiment 4 in which the stack of the oxide semiconductor layers of this embodiment is used as the oxide semiconductor layer 144, an electric field is not applied from one surface to the other surface of the oxide semiconductor layer and current does not flow in the thickness direction (from one surface to the other surface; specifically, in the vertical direction in FIG. 10B) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor film and a second crystalline oxide semiconductor film, like the oxide semiconductor layer 453, the transistor can have stable electric characteristics and high reliability.

This embodiment can be implemented in an appropriate combination with any of the structures described in the other embodiments.

Embodiment 7

A potential output from the potential divider circuit included in the semiconductor device disclosed in this specification which is described in the above embodiments can be used for a variety of loads, so that semiconductor devices having diverse functions can be provided. A block diagram of one mode of the semiconductor device disclosed in this specification is illustrated in FIG. 16.

Figure 16:
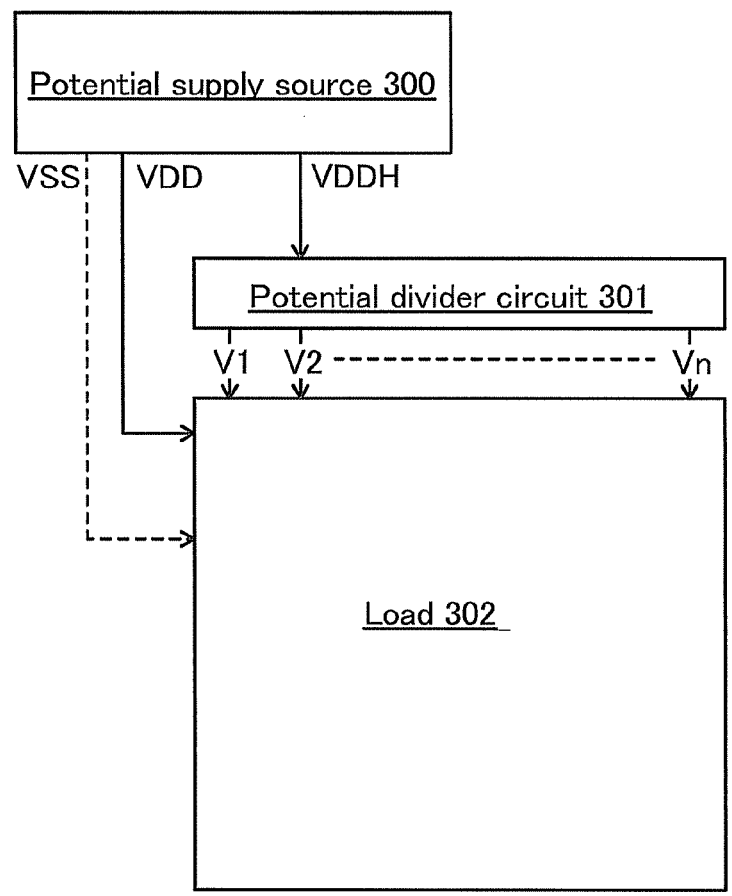
FIG. 16 is a block diagram illustrating one mode of a semiconductor device.

The semiconductor device illustrated in FIG. 16 has a potential supply source 300, a potential divider circuit 301, and a load 302. From the potential supply source 300, a high potential VDDH is supplied to the potential divider circuit 301, and a potential VDD and a potential VSS are supplied to the load 302. In the potential divider circuit 301, a potential supplied from the potential supply source 300 is divided, and the potentials obtained are supplied as the potentials V1 to Vn to the load 302.

As the load 302, a display panel provided with a pixel portion, a driver circuit portion, or the like (e.g., a liquid crystal panel or a light-emitting panel), or a memory provided with a row decoder circuit, a column decoder circuit, a memory cell, or the like, for example, can be used. When a memory is used as the load 302, a step-up circuit or the like can be used as the potential supply source 300.

The semiconductor device disclosed in this specification is suitable for potential supply to a variety of loads 302. Semiconductor devices having diverse functions can be provided depending on selection of the load 302.

Electronic devices to which the semiconductor device described in the above Embodiments is applied will be described with reference to FIGS. 17A to 17F. In this embodiment, the above-described semiconductor device is applied to electronic devices such as computers, mobile phone sets (also referred to as mobile phones or mobile phone devices), portable information terminals (including portable game machines, audio playback devices, and the like), digital cameras, digital video cameras, electronic paper, television sets (also referred to as televisions or television receivers), and the like.

Figure 17A:
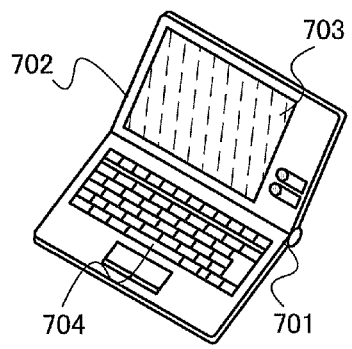
FIGS. 17A to 17F illustrate electronic devices.

FIG. 17A illustrates a notebook personal computer, which includes a housing 701, a housing 702, a display portion 703, a keyboard 704, and the like. The semiconductor device described in the above Embodiments is provided in at least one of the housings 701 and 702. Thus, a notebook personal computer with sufficiently low power consumption can be realized.

Figure 17D:
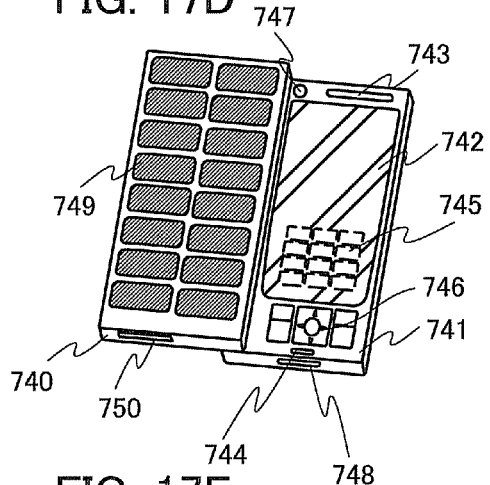
Figure 17B:
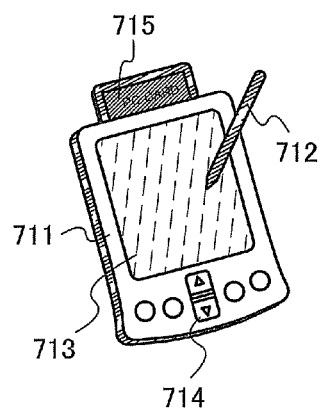

FIG. 17B illustrates a portable information terminal (PDA). A main body 711 is provided with a display portion 713, an external interface 715, operation buttons 714, and the like. Further, a stylus 712 for operation of the portable information terminal, or the like is provided. The semiconductor device described in the above Embodiments is provided in the main body 711. Thus, a portable information terminal with sufficiently low power consumption can be realized.

Figure 17E:
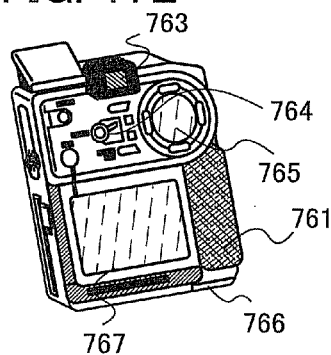
Figure 17C:
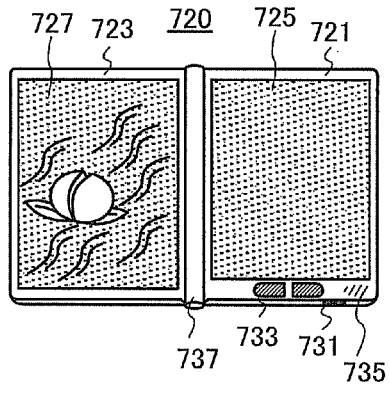

FIG. 17C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book can be opened and closed using the hinge 737 as an axis. In addition, the housing 721 is provided with a power switch 731, operation keys 733, a speaker 735, and the like. At least one of the housings 721 and 723 is provided with the semiconductor device described in the above Embodiments. Thus, an electronic book with sufficiently low power consumption can be realized.

FIG. 17D illustrates a mobile phone set, which includes two housings, a housing 740 and a housing 741. Moreover, the housings 740 and 741, which are developed as illustrated in FIG. 17D, can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. The semiconductor device described in the above Embodiments is provided in at least one of the housings 740 and 741. Thus, a mobile phone set with sufficiently low power consumption can be realized.

FIG. 17E illustrates a digital camera, which includes a main body 761, a display portion 767, an eyepiece 763, an operation switch 764, a display portion 765, a battery 766, and the like. The semiconductor device described in the above Embodiments is provided in the main body 761. Thus, a digital camera with sufficiently low power consumption can be realized.

Figure 17F:
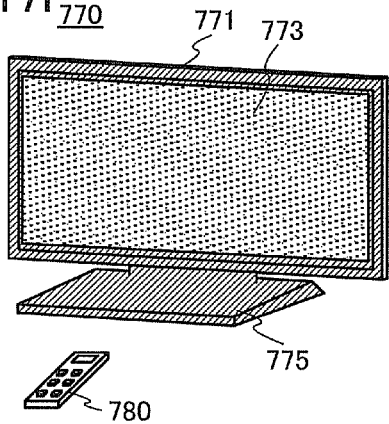

FIG. 17F is a television set 770, which includes a housing 771, a display portion 773, a stand 775, and the like. The television set 770 can be operated with a switch included in the housing 771 or with a remote controller 780. The semiconductor device described in the above Embodiments is mounted in the housing 771 and the remote controller 780. Thus, a television set with sufficiently low power consumption can be realized.

As described above, the electronic devices described in this embodiment each include the semiconductor device according to the above Embodiments. Therefore, electronic devices with low power consumption can be realized.

This application is based on Japanese Patent Application serial No. 2010-190591 filed with the Japan Patent Office on Aug. 27, 2010, the entire contents of which are hereby incorporated by reference.

What is claimed is:

1. A semiconductor device comprising:
   a potential divider circuit comprising:
      a power supply line;
      a selection line;
      an operational amplifier circuit including a first transistor, the first transistor including a first gate, a first source and a first drain;
      a first resistor and a second resistor, the first resistor and the second resistor being connected in series to the power supply line; and
      a switch transistor including a gate, a source and a drain, the gate being electrically connected to the selection line, the source being electrically connected to a node between the first resistor and the second resistor, and the drain being electrically connected to the first gate of the first transistor of the operational amplifier circuit,
   wherein a semiconductor substrate including silicon includes a channel formation region of the first transistor,
   wherein a first electrode including the first gate is over the channel formation region of the first transistor,
   wherein an oxide semiconductor layer including a channel formation region of the switch transistor is above the first electrode,
   wherein a second electrode electrically connected to the oxide semiconductor layer is over and in contact with the first electrode, and
   wherein a third electrode including the gate is over the oxide semiconductor layer.

2. A semiconductor device according to claim 1, wherein the operational amplifier circuit comprises: a constant current source;
   a second transistor including a second gate, a second source and a second drain, the second source being electrically connected to the first source and to the constant current source;
   a third transistor including a third gate, a third source and a third drain; and
   a fourth transistor including a fourth gate, a fourth source and a fourth drain, the fourth gate being electrically connected to the third gate, the third drain and the first drain, the fourth source being electrically connected to the third source, and the fourth drain being electrically connected to the second drain and the second gate.

3. A semiconductor device according to claim 1, wherein the potential divider circuit comprises a potential controller transistor configured so that the first resistor and the second resistor are electrically connected to the power supply line through a source and a drain of the potential controller transistor.

4. A semiconductor device according to claim 3, wherein a gate of the potential controller transistor is electrically connected to the gate of the switch transistor.

5. A semiconductor device according to claim 1, further comprising:
   a potential supply source configured to supply a potential to the potential divider circuit; and
   a load connected to outputs of the potential supply source and to outputs of the potential divider circuit.

6. A semiconductor device according to claim 1,
wherein the switch transistor and the first transistor are formed over a same substrate, and
wherein the switch transistor is over the first transistor.

7. A semiconductor device according to claim 1,
wherein the semiconductor device is any one of a computer, a mobile phone set, a portable information terminal, a digital camera, a digital video camera, electronic paper and a television set.

8. A semiconductor device according to claim 1, wherein the oxide semiconductor layer comprises indium.

9. A method of driving a semiconductor device comprising:
a potential divider circuit comprising:
a power supply line;
a selection line;
an operational amplifier circuit including a first transistor; the first transistor including a first gate, a first source and a first drain;
a first resistor and a second resistor, the first resistor and the second resistor being connected in series to the power supply line; and
a switch transistor including a gate, a source and a drain, the gate being electrically connected to the selection line, the source being electrically connected to a node between the first resistor and the second resistor, and the drain being electrically connected to the first gate of the first transistor of the operational amplifier circuit to form a second node,
the method comprising:
dividing a first potential supplied to the power supply line with the first resistor and the second resistor to obtain a second potential;
applying the second potential to the operational amplifier circuit through the switch transistor when the switch transistor is turned on;
holding the second potential at the second node when the switch transistor is turned off; and
outputting the second potential from the operational amplifier circuit, the switch transistor being either turned on or turned off,
wherein a semiconductor substrate including silicon includes a channel formation region of the first transistor,
wherein a first electrode including the first gate is over the channel formation region of the first transistor,
wherein an oxide semiconductor layer including a channel formation region of the switch transistor is above the first electrode,
wherein a second electrode electrically connected to the oxide semiconductor layer is over and in contact with the first electrode, and
wherein a third electrode including the gate is over the oxide semiconductor layer.

10. A method of driving a semiconductor device according to claim 9,
wherein the semiconductor device comprises a potential controller transistor configured so that the first resistor and the second resistor are electrically connected to the power supply line through a source and a drain of the potential controller transistor, and
wherein the potential controller transistor is turned off when the switch transistor is turned off.

11. A method of driving a semiconductor device according to claim 9, wherein the oxide semiconductor layer comprises indium.

12. A semiconductor device comprising:
a potential divider circuit comprising:
a power supply line;
a selection line;
an operational amplifier circuit including a first transistor, the first transistor including a first gate, a first source and a first drain;
a first resistor and a second resistor, the first resistor and the second resistor being connected in series to the power supply line; and
a switch transistor including a gate, a source and a drain, the gate being electrically connected to the selection line, the source being electrically connected to a node between the first resistor and the second resistor, and the drain being electrically connected to the first gate of the first transistor of the operational amplifier circuit,
wherein the potential divider circuit comprises a potential controller transistor configured so that the first resistor and the second resistor are electrically connected to the power supply line through a source and a drain of the potential controller transistor,
wherein the potential controller transistor includes a channel formation region including an oxide semiconductor,
wherein a semiconductor substrate including silicon includes a channel formation region of the first transistor,
wherein a first electrode including the first gate is over the channel formation region of the first transistor,
wherein an oxide semiconductor layer including a channel formation region of the switch transistor is above the first electrode,
wherein a second electrode electrically connected to the oxide semiconductor layer is over and in contact with the first electrode, and
wherein a third electrode including the gate is over the oxide semiconductor layer.

13. A semiconductor device according to claim 12, wherein the operational amplifier circuit comprises: a constant current source;
a second transistor including a second gate, a second source and a second drain, the second source being electrically connected to the first source and to the constant current source;
a third transistor including a third gate, a third source and a third drain; and
a fourth transistor including a fourth gate, a fourth source and a fourth drain, the fourth gate being electrically connected to the third gate, the third drain and the first drain, the fourth source being electrically connected to the third source, and the fourth drain being electrically connected to the second drain and the second gate.

14. A semiconductor device according to claim 12, wherein a gate of the potential controller transistor is electrically connected to the gate of the switch transistor.

15. A semiconductor device according to claim 12, further comprising:
a potential supply source configured to supply a potential to the potential divider circuit; and
a load connected to outputs of the potential supply source and to outputs of the potential divider circuit.

16. A semiconductor device according to claim 12,
wherein the switch transistor and the first transistor are formed over a same substrate, and
wherein the switch transistor is over the first transistor.

17. A semiconductor device according to claim 12, wherein the semiconductor device is any one of a computer, a mobile phone set, a portable information terminal, a digital camera, a digital video camera, electronic paper and a television set.

* * * * *